(12) United States Patent
Tsubuku et al.

(10) Patent No.: US 9,829,533 B2
(45) Date of Patent: Nov. 28, 2017

(54) SEMICONDUCTOR FILM AND SEMICONDUCTOR DEVICE

(71) Applicant: Semiconductor Energy Laboratory Co., Ltd., Atsugi-shi, Kanagawa-ken (JP)

(72) Inventors: Masashi Tsubuku, Atsugi (JP); Ryosuke Watanabe, Yamato (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/196,281

(22) Filed: Mar. 4, 2014

(65) Prior Publication Data

US 2014/0252345 A1 Sep. 11, 2014

(30) Foreign Application Priority Data

Mar. 6, 2013 (JP) .................................. 2013-044225
Mar. 26, 2013 (JP) .................................. 2013-063720

(51) Int. Cl.
*H01L 29/10* (2006.01)
*G01R 31/265* (2006.01)
(Continued)

(52) U.S. Cl.
CPC .... *G01R 31/2656* (2013.01); *H01L 21/02488* (2013.01); *H01L 21/02554* (2013.01);
(Continued)

(58) Field of Classification Search
CPC ............. H01L 27/1225; H01L 27/1251; H01L 29/78693
(Continued)

(56) References Cited

U.S. PATENT DOCUMENTS 5,470,762 A 11/1995 Codama et al.
5,528,032 A 6/1996 Uchiyama
(Continued)

FOREIGN PATENT DOCUMENTS

CN 102834922 12/2012
EP 1737044 A 12/2006
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Brook Kebede
(74) *Attorney, Agent, or Firm* — Eric J. Robinson; Robinson Intellectual Property Law Office, P.C.

(57) ABSTRACT

An oxide semiconductor film having high stability with respect to light irradiation or a semiconductor device having high stability with respect to light irradiation is provided. One embodiment of the present invention is a semiconductor film including an oxide in which light absorption is observed by a constant photocurrent method (CPM) in a wavelength range of 400 nm to 800 nm, and in which an absorption coefficient of a defect level, which is obtained by removing light absorption due to a band tail from the light absorption, is lower than or equal to $5 \times 10^{-2}$/cm. Alternatively, a semiconductor device is manufactured using the semiconductor film.

13 Claims, 29 Drawing Sheets

(51) Int. Cl.
*H01L 29/786* (2006.01)
*H01L 21/02* (2006.01)
*H01L 21/66* (2006.01)

(52) U.S. Cl.
CPC .. *H01L 21/02565* (2013.01); *H01L 21/02631* (2013.01); *H01L 29/7869* (2013.01); *H01L 29/78693* (2013.01); *H01L 29/78696* (2013.01); *H01L 22/12* (2013.01); *H01L 22/14* (2013.01)

(58) Field of Classification Search
USPC .......................................... 257/43, E29.296
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,757,030 A | 5/1998 | Codama et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,910,490 B2 | 3/2011 | Akimoto et al. |
| 7,932,521 B2 | 4/2011 | Akimoto et al. |
| 7,977,151 B2 * | 7/2011 | Shieh et al. .................. 438/104 |
| 7,994,500 B2 | 8/2011 | Kim et al. |
| 8,058,645 B2 | 11/2011 | Jeong et al. |
| 8,129,717 B2 | 3/2012 | Yamazaki et al. |
| 8,129,719 B2 | 3/2012 | Yamazaki et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,216,879 B2 | 7/2012 | Kaji et al. |
| 8,237,166 B2 | 8/2012 | Kumomi et al. |
| 8,274,077 B2 | 9/2012 | Akimoto et al. |
| 8,274,078 B2 | 9/2012 | Itagaki et al. |
| 8,278,136 B2 | 10/2012 | Tanaka et al. |
| 8,378,351 B2 | 2/2013 | Fukumoto et al. |
| 8,420,456 B2 | 4/2013 | Okamoto |
| 8,466,463 B2 | 6/2013 | Akimoto et al. |
| 8,502,221 B2 | 8/2013 | Yamazaki |
| 9,306,079 B2 | 4/2016 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0267141 A1 | 11/2006 | Saito |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0299702 A1 | 12/2008 | Son et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0142887 A1 | 6/2009 | Son et al. |
| 2009/0152506 A1 | 6/2009 | Umeda et al. |
| 2009/0152541 A1 | 6/2009 | Maekawa et al. |
| 2009/0206332 A1 | 8/2009 | Son et al. |
| 2009/0239335 A1 | 9/2009 | Akimoto et al. |
| 2009/0250693 A1 | 10/2009 | Jeong et al. |
| 2009/0250701 A1 | 10/2009 | Kimura |
| 2009/0278122 A1 | 11/2009 | Hosono et al. |
| 2009/0280600 A1 | 11/2009 | Hosono et al. |
| 2009/0294765 A1 | 12/2009 | Tanaka et al. |
| 2009/0305461 A1 | 12/2009 | Akimoto et al. |
| 2009/0321731 A1 | 12/2009 | Jeong et al. |
| 2010/0038641 A1 | 2/2010 | Imai |
| 2010/0065844 A1 | 3/2010 | Tokunaga |
| 2010/0084648 A1 | 4/2010 | Watanabe |

(56) References Cited

U.S. PATENT DOCUMENTS

| | | | |
|---|---|---|---|
| 2010/0092800 A1 | 4/2010 | Itagaki et al. | |
| 2010/0109002 A1 | 5/2010 | Itagaki et al. | |
| 2010/0136743 A1 | 6/2010 | Akimoto et al. | |
| 2010/0207119 A1 | 8/2010 | Sakata et al. | |
| 2010/0213460 A1 | 8/2010 | Kondo et al. | |
| 2010/0252826 A1 | 10/2010 | Yamazaki et al. | |
| 2010/0295041 A1 | 11/2010 | Kumomi et al. | |
| 2010/0301329 A1 | 12/2010 | Asano et al. | |
| 2010/0320458 A1 | 12/2010 | Umeda et al. | |
| 2010/0320459 A1* | 12/2010 | Umeda et al. | 257/43 |
| 2011/0003429 A1 | 1/2011 | Oikawa et al. | |
| 2011/0076790 A1 | 3/2011 | Ofuji et al. | |
| 2011/0089417 A1 | 4/2011 | Yamazaki et al. | |
| 2011/0104851 A1 | 5/2011 | Akimoto et al. | |
| 2011/0115763 A1 | 5/2011 | Yamazaki et al. | |
| 2011/0117697 A1 | 5/2011 | Akimoto et al. | |
| 2011/0117698 A1 | 5/2011 | Suzawa et al. | |
| 2011/0121290 A1 | 5/2011 | Akimoto et al. | |
| 2011/0140100 A1 | 6/2011 | Takata et al. | |
| 2011/0147738 A1 | 6/2011 | Yamazaki et al. | |
| 2011/0156026 A1 | 6/2011 | Yamazaki et al. | |
| 2011/0163311 A1 | 7/2011 | Akimoto et al. | |
| 2011/0193083 A1 | 8/2011 | Kim et al. | |
| 2011/0204368 A1 | 8/2011 | Tsubuku et al. | |
| 2011/0212570 A1 | 9/2011 | Yamazaki et al. | |
| 2011/0215328 A1 | 9/2011 | Morosawa et al. | |
| 2011/0240990 A1 | 10/2011 | Yamazaki | |
| 2011/0260171 A1 | 10/2011 | Yamazaki | |
| 2011/0263082 A1 | 10/2011 | Yamazaki | |
| 2011/0263083 A1 | 10/2011 | Yamazaki | |
| 2011/0263084 A1 | 10/2011 | Yamazaki | |
| 2011/0263085 A1 | 10/2011 | Yamazaki | |
| 2011/0263091 A1 | 10/2011 | Yamazaki | |
| 2011/0281394 A1 | 11/2011 | Yamazaki | |
| 2011/0298027 A1 | 12/2011 | Isobe et al. | |
| 2012/0032730 A1* | 2/2012 | Koyama | 327/530 |
| 2012/0086000 A1 | 4/2012 | Mizoguchi et al. | |
| 2012/0104385 A1 | 5/2012 | Godo et al. | |
| 2012/0108006 A1 | 5/2012 | Yamazaki et al. | |
| 2012/0108007 A1 | 5/2012 | Yamazaki et al. | |
| 2012/0119205 A1 | 5/2012 | Taniguchi et al. | |
| 2012/0122277 A1 | 5/2012 | Yamazaki et al. | |
| 2012/0139019 A1 | 6/2012 | Iba | |
| 2012/0153278 A1 | 6/2012 | Jeong et al. | |
| 2012/0161126 A1 | 6/2012 | Yamazaki | |
| 2012/0175609 A1 | 7/2012 | Yamazaki | |
| 2012/1018739 | 7/2012 | Yamazakis et al. | |
| 2012/0229724 A1 | 9/2012 | Miyairi et al. | |
| 2012/0267624 A1 | 10/2012 | Isobe et al. | |
| 2012/0305913 A1 | 12/2012 | Yamazaki et al. | |
| 2012/0319102 A1* | 12/2012 | Yamazaki | H01L 29/7869 257/43 |
| 2012/0319183 A1 | 12/2012 | Yamazaki et al. | |
| 2013/0126862 A1 | 5/2013 | Yamazaki | |
| 2013/0146870 A1 | 6/2013 | Yamazaki | |
| 2013/0313550 A1 | 11/2013 | Yamazaki | |
| 2013/0320330 A1 | 12/2013 | Yamazaki | |
| 2013/0320334 A1 | 12/2013 | Yamazaki et al. | |
| 2013/0334523 A1 | 12/2013 | Yamazaki | |
| 2013/0334533 A1 | 12/2013 | Yamazaki | |
| 2014/0103339 A1 | 4/2014 | Yamazaki et al. | |
| 2014/0110703 A1 | 4/2014 | Yamazaki | |
| 2014/0113405 A1 | 4/2014 | Tsubuku et al. | |
| 2014/0239267 A1 | 8/2014 | Byun | |
| 2014/1033954 | 11/2014 | Hanaokak et al. | |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-268224 A | 9/1994 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2007-123861 A | 5/2007 |
| JP | 2008-533693 | 8/2008 |
| JP | 2008-281988 A | 11/2008 |
| JP | 2009-021565 A | 1/2009 |
| JP | 2009-231613 A | 10/2009 |
| JP | 2009-277702 A | 11/2009 |
| JP | 2010-016347 A | 1/2010 |
| JP | 4415062 | 2/2010 |
| JP | 2010-067954 A | 3/2010 |
| JP | 2010-177431 A | 8/2010 |
| JP | 4571221 | 10/2010 |
| JP | 2011-222767 A | 11/2011 |
| JP | 2011-228695 A | 11/2011 |
| JP | 2011-243745 A | 12/2011 |
| JP | 2012-099796 A | 5/2012 |
| JP | 2012-119564 A | 6/2012 |
| JP | 2012-160679 A | 8/2012 |
| JP | 2012-160720 A | 8/2012 |
| JP | 2012-191023 A | 10/2012 |
| JP | 2012-208481 A | 10/2012 |
| JP | 2012-256825 A | 12/2012 |
| WO | WO-2004/114391 | 12/2004 |
| WO | WO-2007/094501 | 8/2007 |
| WO | WO-2008/126879 | 10/2008 |
| WO | WO-2008/133345 | 11/2008 |
| WO | WO-2009/139482 | 11/2009 |
| WO | WO-2011/122364 | 10/2011 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C", Journal of Solid State Chemistry, 1985, vol. 60, pp. 382-384.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

(56) References Cited

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02: Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07: SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of The 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of The 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper: World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 046501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-072104-3.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Oh.M et al., "Improving the Gate Stability of ZnO Thin-Film Transistors With Aluminum Oxide Dielectric layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Shimizu.K, "Evaluation of Level in Gap in Amorphous InGaZnO Thin Film", The 41st Academic Lecture Meeting, College of Industrial Technology, Nihon University, Jan. 1, 2008, pp. 2-004.
Barquinha.P et al., "Effect of UV and visible light radiation on the electrical performances of transparent TFTs based on amorphous indium zinc oxide", J. Non-Cryst. Solids (Journal of Non-Crystalline Solids), Jun. 15, 2006, vol. 352, No. 9-20, pp. 1756-1760.
Lee.K et al., "The effect of moisture on the photon-enhanced negative bias thermal instability in Ga—In—Zn—O thin film transistors", Appl. Phys. Lett. (Applied Physics Letters), Dec. 7, 2009, vol. 95, No. 23, pp. 232106-1-232106-3.
Fung.T et al., "Photofield-Effect in Amorphous InGaZnO TFTs", IMID '08 Digest of Technical Papers, 2008, pp. 1208-1211.
Lee.D et al., "Steady-state photoconductivity of amorphous In—Ga—Zn—O", Thin Solid Films, Mar. 31, 2010, vol. 518, No. 11, pp. 3000-3003.
Inoue.T et al., "New construction of photoconductivity and its spectral response in amorphous In—Ga—Zn—O", AM-FPD '10 Digest of Technical Papers, Jul. 5, 2010, pp. 33-36.
Tsubuku.M et al., "Photo-Current Response and Negative Bias Stability Under Light Irradiation in IGZO-TFT", IDW '10: Proceedings of the 16th International Display Workshops, Dec. 1, 2010, pp. 1841-1844.
Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.
International Search Report (Application No. PCT/JP2011/051684) Dated Apr. 26, 2011.
Written Opinion (Application No. PCT/JP2011/051684) Dated Apr. 26, 2011.
International Search Report (Application No. PCT/JP2013/078634) Dated Jan. 28, 2014.
Written Opinion (Application No. PCT/JP2013/078634) Dated Jan. 28, 2014.
Kamiya et al., "Carrier transport properties and electronic structures of amorphous oxide semiconductors: the present status,", Solid State Physics, Sep. 1, 2009, vol. 44, No. 9, pp. 621-633, Agne Gijutsu Center.

* cited by examiner

Not containing hydrogen  6.12g/cm³

H : 3.45 atom%  (3E+21/cm³)

H : 6.67 atom% (6E+21/cm³)

● : In    ● : Ga    ● : Zn    ● : O    ● : H 2600K (5~10 psec)

2700K (0~5 psec)

SEMICONDUCTOR FILM AND SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a driving method thereof, or a manufacturing method thereof. In particular, the present invention relates to an oxide semiconductor film and a semiconductor device.

2. Description of the Related Art

Transistors used for most flat panel displays typified by a liquid crystal display device and a light-emitting display device are formed using an amorphous-based silicon semiconductor or a crystal-based silicon semiconductor silicon provided over glass substrates. Further, transistors formed using such silicon semiconductors are used in integrated circuits (ICs) and the like.

In recent years, attention has been drawn to a technique of using, instead of a silicon semiconductor, a metal oxide exhibiting semiconductor characteristics for transistors. Note that in this specification and the like, a metal oxide exhibiting semiconductor characteristics is referred to as an oxide semiconductor.

For example, a technique is disclosed in which a transistor is manufactured using zinc oxide or an In—Ga—Zn-based oxide as an oxide semiconductor and the transistor is used as a switching element or the like of a pixel of a display device (see Patent Documents 1 and 2).

Further, in Non-Patent Document 1, it has been reported that an amorphous In—Ga—Zn—O film has an extremely high defect level density of $1\times10^{20}/cm^3$ or higher and the number of defects is reduced by almost half by heat treatment.

REFERENCE

Patent Document

[Patent Document 1] Japanese Published Patent Application No. 2007-123861

[Patent Document 2] Japanese Published Patent Application No. 2007-096055

Non-Patent Document

[Non-Patent Document 1] Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633

SUMMARY OF THE INVENTION

An oxide semiconductor film is affected by light irradiation in various ways. In particular, in a transistor including an oxide semiconductor film, a phenomenon called negative-bias stress photodegradation is known to occur. For example, in a negative bias-temperature photostress test in which a negative bias is applied to a gate of the transistor and a thermal stress is applied to the transistor while a channel formation region thereof is irradiated with light, the threshold voltage of the transistor is changed. Particularly when the defect level density in the oxide semiconductor film is high as described in Non-Patent Document 1, the threshold voltage of the transistor including the oxide semiconductor film might be largely changed.

Such a change in electrical characteristics of the transistor is a cause of a reduction in the reliability of a semiconductor device including the transistor.

Thus, one object of one embodiment of the present invention is to provide an oxide semiconductor film having high stability with respect to light irradiation. Another object of one embodiment of the present invention is to provide a semiconductor device having high stability with respect to light irradiation. Another object of one embodiment of the present invention is to provide a semiconductor device which can suppress a decrease in electrical characteristics. Another object of one embodiment of the present invention is to provide a semiconductor device with low power consumption. Another object of one embodiment of the present invention is to provide a semiconductor device with high reliability. Another object of one embodiment of the present invention is to provide a semiconductor device in which deterioration of threshold voltage is reduced. Another object of one embodiment of the present invention is to provide a novel semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to an oxide semiconductor layer with a low defect level density and a semiconductor device including the oxide semiconductor layer.

One embodiment of the present invention is a semiconductor film including an oxide in which light absorption is observed by a constant photocurrent method (CPM) in a wavelength range of 400 nm to 800 nm, and in which an absorption coefficient of a defect level, which is obtained by removing light absorption due to a band tail from the light absorption, is lower than or equal to $5\times10^{-2}/cm$.

The oxide preferably includes a crystal part whose c-axis is substantially perpendicular to a surface of the oxide.

For the oxide, an In-M-Zn oxide (M is Al, Ti, Ga, Y, Zr, La, Ce, Nd, or Hf) can be used.

Another embodiment of the present invention is a semiconductor device including a gate electrode layer, a gate insulating film in contact with the gate electrode layer, an oxide semiconductor layer overlapping with the gate electrode layer with the gate insulating film provided therebetween, and a source electrode layer and a drain electrode layer in contact with the oxide semiconductor layer. In the oxide semiconductor layer, light absorption is observed by a constant photocurrent method (CPM) in a wavelength range of 400 nm to 800 nm. An absorption coefficient of a defect level, which is obtained by removing light absorption due to a band tail from the light absorption, is lower than or equal to $5\times10^{-2}/cm$.

The oxide semiconductor layer preferably includes a crystal part whose c-axis is substantially perpendicular to a surface of the oxide semiconductor layer.

For the oxide semiconductor layer, an In-M-Zn oxide (M is Al, Ti, Ga, Y, Zr, La, Ce, Nd, or Hf) can be used.

The oxide semiconductor layer may be a multilayer film in which a first oxide semiconductor layer, a second oxide semiconductor layer, and a third oxide semiconductor layer are stacked in this order.

Energies of conduction band minimums of the first oxide semiconductor layer and the third oxide semiconductor layer are each closer to a vacuum level than an energy of a conduction band minimum of the second oxide semiconductor layer by 0.05 eV or more and 2 eV or less.

The second oxide semiconductor layer preferably includes a crystal part whose c-axis is substantially perpendicular to a surface of the second oxide semiconductor layer.

The first to third oxide semiconductor layers are each an In-M-Zn oxide (M is Al, Ti, Ga, Y, Zr, La, Ce, Nd, or Hf), and an atomic ratio of M to In in each of the first oxide semiconductor layer and the third oxide semiconductor layer is larger than an atomic ratio of M to In in the second oxide semiconductor layer.

According to one embodiment of the present invention, an oxide semiconductor film having high stability with respect to light irradiation can be provided. A semiconductor device having high stability with respect to light irradiation can be provided. A semiconductor device which can suppress a decrease in electrical characteristics can be provided. A semiconductor device with low power consumption can be provided. A semiconductor device with high reliability can be provided. A semiconductor device in which deterioration of threshold voltage is reduced can be provided. Alternatively, a novel semiconductor device or the like can be provided.

Note that the descriptions of these effects do not disturb the existence of other effects. Note that one embodiment of the present invention does not necessarily achieve all the effects listed above. Other effects will be apparent from and can be derived from the description of the specification, the drawings, the claims, and the like.

DETAILED DESCRIPTION OF THE INVENTION

Figure 1A:
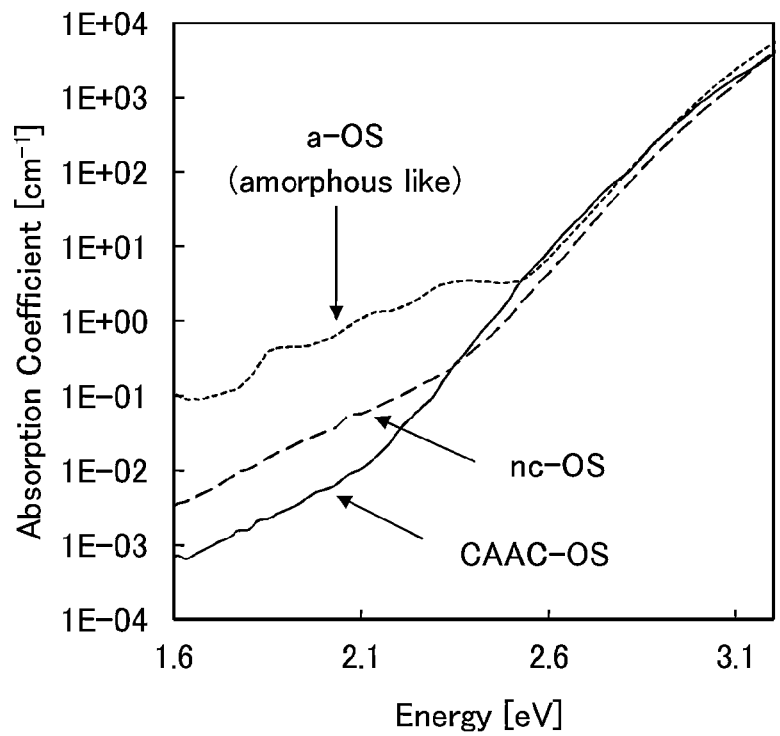
FIGS. 1A and 1B are graphs each showing light absorption due to localized levels in a CAAC-OS film and an amorphous film.

Embodiments and an example of the invention disclosed in this specification and the like are described in detail below with reference to the accompanying drawings. However, the invention disclosed in this specification and the like is not limited to the description below, and it is easily understood by those skilled in the art that modes and details disclosed herein can be modified in various ways. Therefore, the invention disclosed in this specification and the like is not construed as being limited to the description of the following embodiments and example. Note that the ordinal numbers such as "first" and "second" are used for the sake of convenience and do not denote the order of steps or the stacking order of layers. In addition, the ordinal numbers in this specification and the like do not denote particular names which specify the invention.

The semiconductor device of one embodiment of the present invention includes a transistor including an oxide semiconductor film or a circuit including the transistor. For example, an electronic device which includes, as a component, a semiconductor integrated circuit including an LSI, a CPU, a power device mounted in a power circuit, a memory, a thyristor, a converter, an image sensor, or the like; an electro-optical device typified by a liquid crystal display panel; or a light-emitting display device including a light-emitting element is also included in the category of the semiconductor device.

Embodiment 1

In this embodiment, an oxide semiconductor film of one embodiment of the present invention will be described.

Recently, an oxide semiconductor typified by an In—Ga—Zn-based oxide (abbreviated to In—Ga—Zn—O) has attracted attention and practical application to a display device such as a liquid crystal display has begun. Electrical characteristics of a transistor including an In—Ga—Zn—O are excellent compared to those of a transistor including amorphous silicon; for example, mobility is high or an off-state current is low. However, the electrical characteristics are known to deteriorate because of light irradiation, bias-temperature (BT) stress, or the like.

Particularly in a negative bias-temperature photostress test in which a negative bias is applied to a gate of the transistor and a thermal stress is applied to the transistor while a channel formation region thereof is irradiated with light, the threshold voltage is largely shifted in the negative direction. This is a phenomenon peculiar to the transistor including In—Ga—Zn—O, which is called negative-bias stress photodegradation.

The above negative-bias stress photodegradation is related to a defect level that exists in a band gap of In—Ga—Zn—O, which is formed because of oxygen vacancies and the like. The existence of the defect level can be confirmed from the photoresponse characteristics of an In—Ga—Zn—O film.

The photoresponse characteristics of the In—Ga—Zn—O film can be confirmed in such a manner that, for example, a pair of electrodes is formed over the In—Ga—Zn—O film formed on an insulating surface, a region between the pair of electrodes is irradiated with light, and a change in current that flows between the pair of electrodes is measured.

It is found from the above method that as for the photoresponse characteristics, the In—Ga—Zn—O film shows very slow photoresponse in which current does not relax rapidly and a current value is lowered gradually even after light irradiation is stopped. This slow relaxation phenomenon occurs because the relaxation of photocurrent is inhibited by a trap level existing at a deep level of the In—Ga—Zn—O film.

Figure 2:
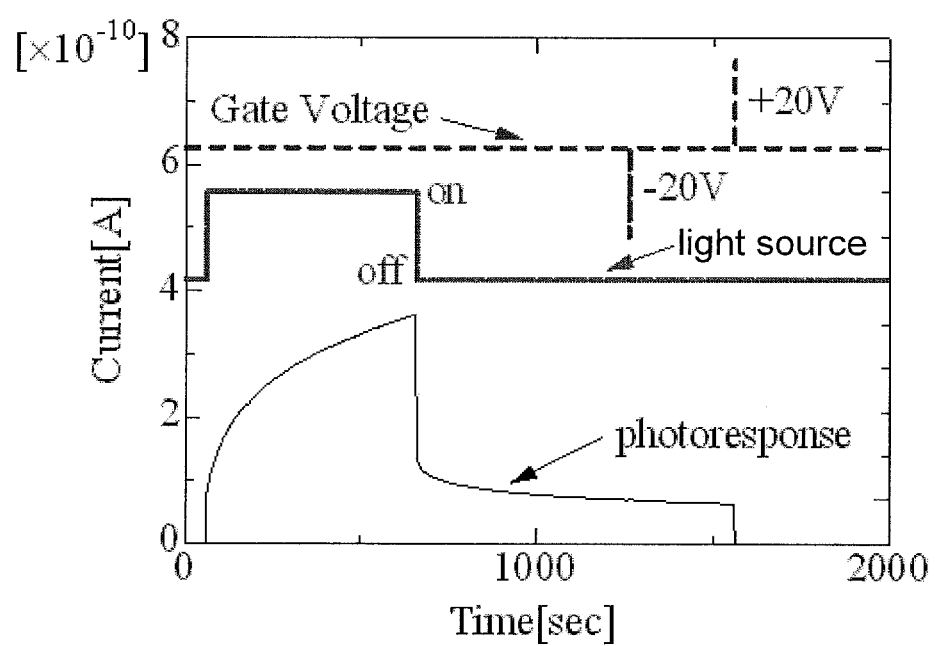
FIG. 2 is a graph showing a measurement result of photocurrent that shows photoresponse characteristics of an In—Ga—Zn—O film.

FIG. 2 is a graph showing a measurement result of photocurrent that shows photoresponse characteristics of the In—Ga—Zn—O film. A transistor of a measurement sample has a structure corresponding to that of a bottom-gate transistor, in which L/W is 30 µm/100000 µm. The measurement voltage (a voltage applied to a drain electrode, which corresponds to Vd) was 0.1 V. With the use of a xenon lamp as a light source, the sample surface was irradiated with light having a wavelength of 400 nm, which was extracted from a spectral filter, at an irradiation intensity of 3.5 mW/cm$^2$. A semiconductor analyzer (B1500 manufactured by Agilent Technologies Inc.) was used for the measurement of the photocurrent. As the sequence of the measurement, light irradiation was started after 60 seconds from the measurement start, light irradiation was stopped after 600 seconds, −20 V was applied to a gate electrode for a second after another 600 seconds, and further +20 V was applied to the gate electrode for a second after 300 seconds. The current that has flown through the drain electrode was continuously measured for 1800 seconds in total.

The measurement result in FIG. 2 shows that, although relaxation of the photocurrent of the In—Ga—Zn—O film is hardly observed at the time of applying a negative bias to the gate electrode, the current value drastically decreases by applying a positive bias. This suggests that trapped charge is released by the positive bias while charge remains trapped by the negative bias.

Regarding a defect level in a band gap of the In—Ga—Zn—O film, the existence of which is suggested by the above photoresponse measurement, evaluation can be performed also by photo luminescence (PL) method and a constant photocurrent method (CPM) which are known as techniques for evaluating the level in a gap in amorphous silicon or the like.

Figure 3:
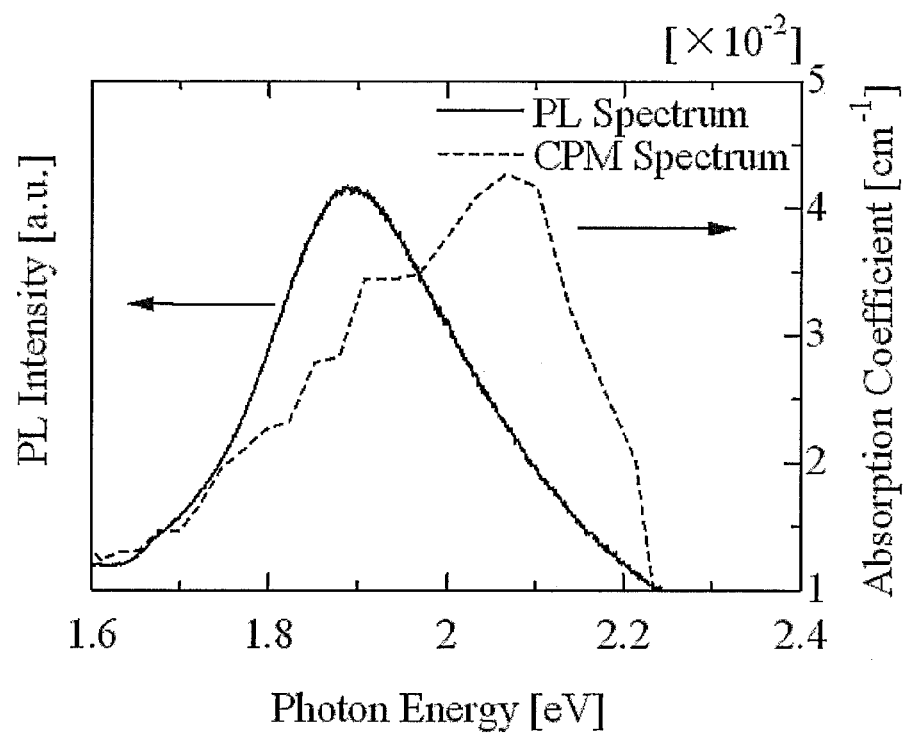
FIG. 3 is a graph showing a PL spectrum and a light absorption spectrum of an In—Ga—Zn—O film.

FIG. 3 shows a PL spectrum and a light absorption spectrum of an In—Ga—Zn—O film obtained by a PL method and a CPM method, respectively. PL spectrum measurement was performed using a PL measurement apparatus manufactured by HORIBA, Ltd. (LabRAM HR-PL), with an excitation wavelength of 325 [nm] and a measurement temperature of 10 [K]. Light absorption spectrum measurement was performed using a subgap light absorption spectrum measurement apparatus manufactured by BUNKOUKEIKI Co., Ltd. By the PL spectrum measurement, light emission due to a defect level can be observed, and by the light absorption spectrum measurement, light absorption due to a defect level can be observed. Although the positions of the peaks of the PL spectrum and the light absorption spectrum are slightly different from each other in FIG. 3, the widths of the spectra are almost the same; each peak has a width range of 1.5 eV to 2.3 eV. The peaks attributable to defect levels of oxygen vacancies are observed.

As described above, the negative-bias stress photodegradation of the transistor including the In—Ga—Zn—O film is related to a defect level that exists in a band gap of In—Ga—Zn—O, which is formed because of oxygen vacancies and the like. Therefore, the In—Ga—Zn—O film with a low defect level density is desired, and a c-axis aligned crystalline oxide semiconductor (CAAC-OS) film has been developed as such a film.

Figure 4:
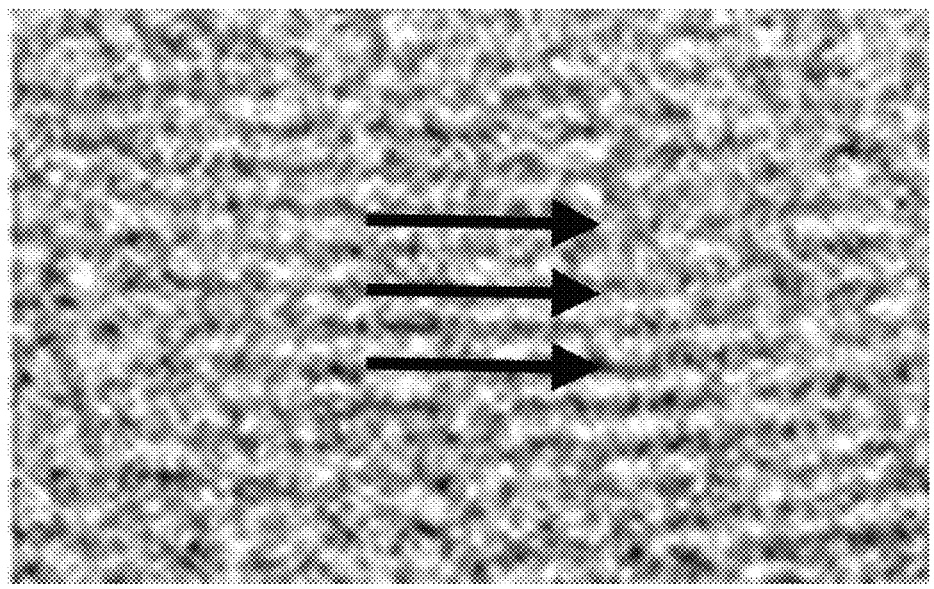
FIG. 4 is a cross-sectional TEM image of a CAAC-OS film.

FIG. 4 is a cross-sectional TEM image of a CAAC-OS film formed using In—Ga—Zn—O as a material. The CAAC-OS film is formed by a sputtering method with the use of an In—Ga—Zn—O material whose atomic ratio of In to Ga and Zn is 1:1:1 as a target. The arrows in the figure represent a-b planes, which are arranged in parallel to the film thickness direction. This shows that the crystals are aligned in a c-axis direction.

Figure 5A:
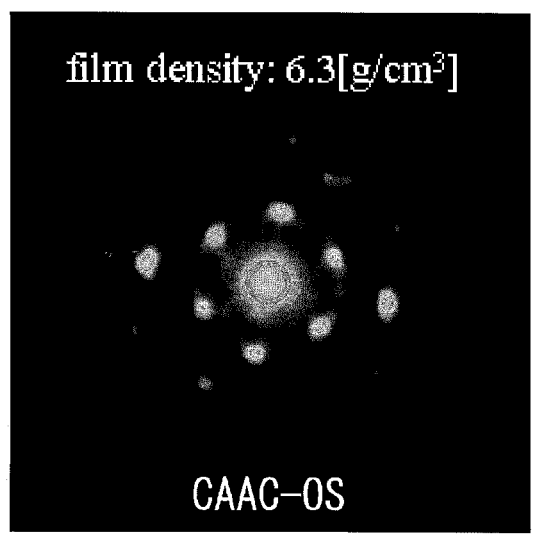
FIGS. 5A to 5C are electron diffraction patterns of In—Ga—Zn—O films.
Figure 5B:
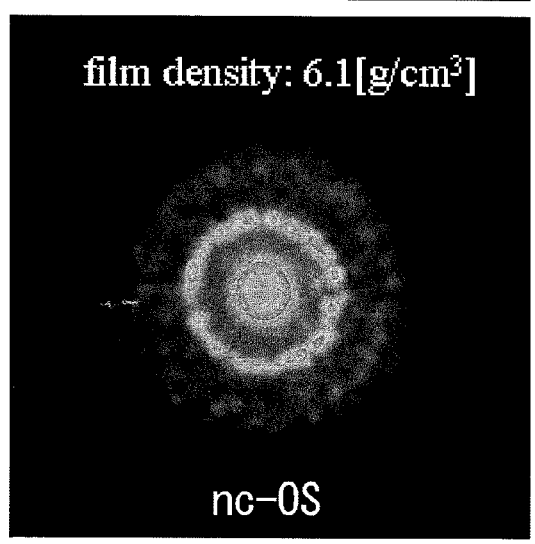
Figure 5C:
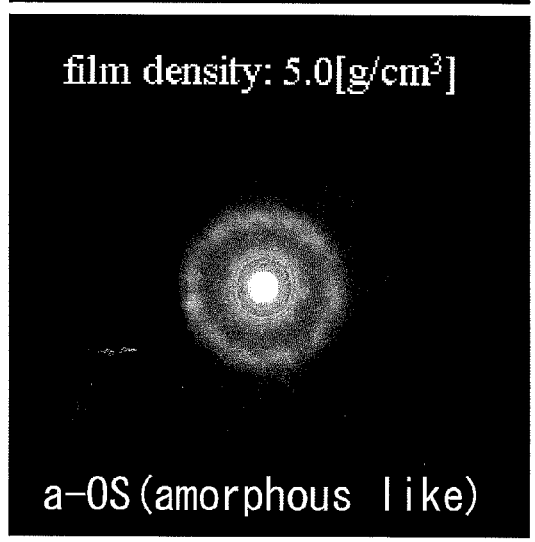

As a result of examining diffraction patterns of various In—Ga—Zn—O films by reducing an electron beam diameter to a nanometer level, a structure of a nano-size crystal (nc) which is different from an amorphous structure was observed, and the diameter of the nc varied from 1 nm to 10 nm. FIGS. 5A, 5B, and 5C show electron diffraction patterns and film densities of a CAAC-OS film, a nc-OS film, and an a-OS film, respectively. In this measurement, a diffraction pattern including bright luminous spots having regularity was observed in the film having a CAAC structure, a diffraction pattern including luminous spots and a halo pattern were observed in the film having a nc structure, and a diffraction pattern including only a halo pattern was observed in the film having an amorphous structure. Although the inventors repeated the experiment strictly, it was difficult to form the a-OS film and to reproduce a pure amorphous structure. Such a CAAC-OS film has a low defect level density in a band gap of In—Ga—Zn—O, which is formed because of oxygen vacancies and the like.

This defect level in the band gap can be quantified by the above CPM method. Here, the CPM method is described in detail.

In CPM method, the amount of light with which a surface of a sample between a pair of electrodes is irradiated is adjusted in the state where voltage is applied between the pair of electrodes included in the sample so that a photocurrent value is kept constant, and then an absorption coefficient is derived from the amount of the irradiation light in each wavelength. In the CPM method, when the sample has a defect, the absorption coefficient due to the energy which corresponds to the level at which the defect exists (calculated from the wavelength) is increased. The increase in the absorption coefficient is multiplied by a constant, whereby the density of states (hereinafter also referred to as DOS) of the sample can be obtained.

Figure 6:
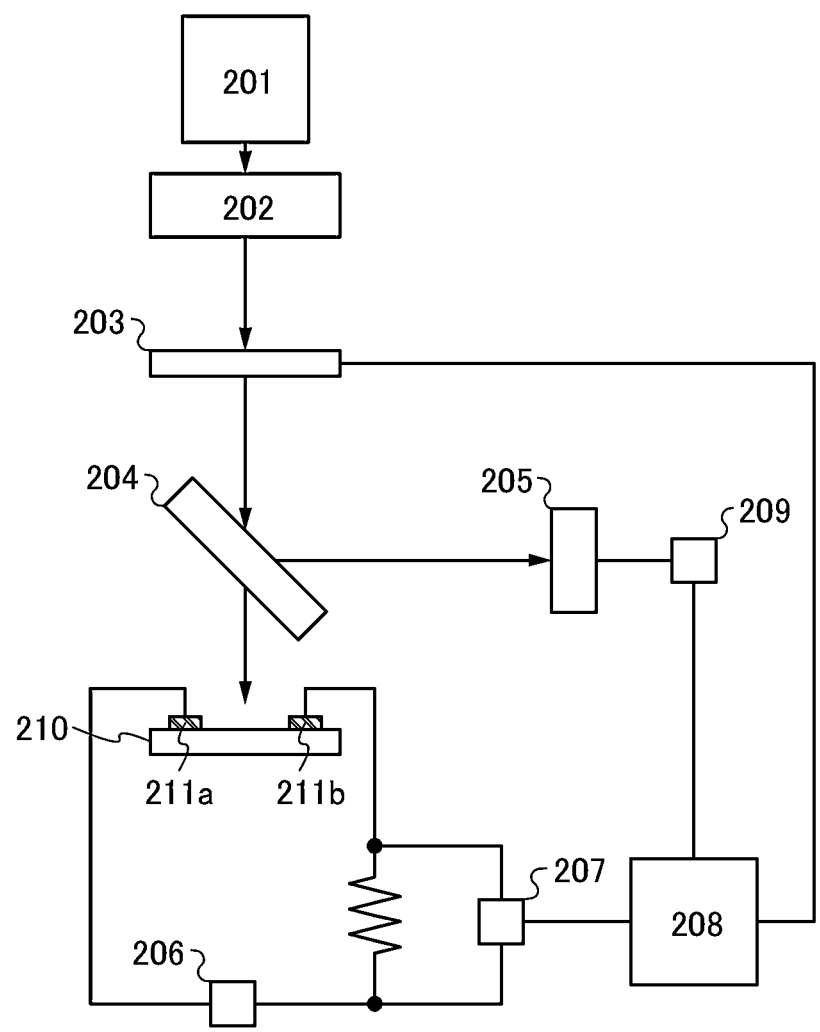
FIG. 6 is a diagram illustrating a CPM measurement apparatus.

FIG. 6 illustrates a schematic diagram of a CPM measurement apparatus. In FIG. 6, light paths are denoted by arrows and wirings and the like are denoted by solid lines.

The CPM measurement apparatus includes a lamp 201 which is a light source, a monochromator 202 which extracts light only in a narrow wavelength range from light in a broad wavelength range, a filter 203 which attenuates light passing through the monochromator 202, a beam splitter 204 which transmits and reflects the light attenuated by the filter 203, a photodiode 205 which converts light into current, a lock-in amplifier 209 which measures current, and a calculator 208 which estimates the amount of the irradiation light from the measured current.

Further, a sample 210 in FIG. 6 is an oxide semiconductor film formed over an insulating surface, for example. Electrodes 211a and 211b for measurement are provided over the oxide semiconductor film. The electrodes 211a and 211b may be formed to have a single-layer structure or a stacked-layer structure using one or more of a metal such as Al, Ti, Cr, Co, Ni, Cu, Y, Zr, Mo, Ag, Ta, W, Pt, and Au, an alloy of any of these metals, and a conductive nitride or oxide of any of these metals. Alternatively, a transparent conductive film containing plural kinds of materials selected from Si, Ti, Ni, Cu, Zn, Ga, In, and Sn may be used. It is preferable to select a material which does not form an insulating film at the interface between the electrode 211a and the oxide semiconductor film and the interface between the electrode 211b and the oxide semiconductor film.

One of the electrodes 211a and 211b is connected to a direct-current power source 206 through a resistor, and a photocurrent value or a difference between the photocurrent value and a dark current value can be measured by a lock-in amplifier 207 connected to the resistor in parallel.

As the lamp 201, a xenon lamp, a mercury lamp, a halogen lamp, or the like can be used, for example. Any one of these lamps or a combination thereof may be used. Note that it is preferable to use a xenon lamp to perform irradiation with light in the range of 1.5 eV to 4.0 eV, which is appropriate for the evaluation of an In—Ga—Zn—O film.

As the filter 203, a neutral density (ND) filter, a wedge filter, a cut filter, or the like can be used. A cut filter is an optical filter which has a function of transmitting light in a specific wavelength range and attenuating light in the other wavelength range. Further, by using the above filters in combination, the amount of the irradiation light or the irradiation wavelength can be controlled more effectively. Note that the filter 203 is not necessarily provided.

The lock-in amplifier 207 and the lock-in amplifier 209 each have a function of amplifying, detecting, and outputting a signal with a specific frequency of the input signals. Thus, the influence of noise or the like is reduced and the signal can be detected in a high sensitivity.

The light emitted from the lamp 201 enters the monochromator 202, whereby light only in a narrow wavelength range is extracted from the light in a broad wavelength range. The light passing through the monochromator 202 is attenuated by entering the filter 203. The attenuated light is emitted to the beam splitter 204, whereby the transmitted light is emitted to the sample 210 and the reflected light is emitted to the photodiode 205. Note that the transmitted light and the reflected light may be emitted to the photodiode 205 and the sample 210, respectively.

The emitted light is converted into current by the photodiode 205. After that, the current is measured by the lock-in amplifier 209, and the amount of the irradiation light can be estimated by the calculator 208. Further, a value of the photocurrent which is generated in the sample 210 by irradiating the sample 210 with light is measured by the lock-in amplifier 207. The obtained photocurrent value is fed back to the filter 203 by the calculator 208. When the photocurrent value is too high, the transmittance of the filter 203 is decreased to reduce the amount of the irradiation light. When the photocurrent value is too low, the transmittance of the filter 203 is increased to increase the amount of the irradiation light.

Figure 7A:
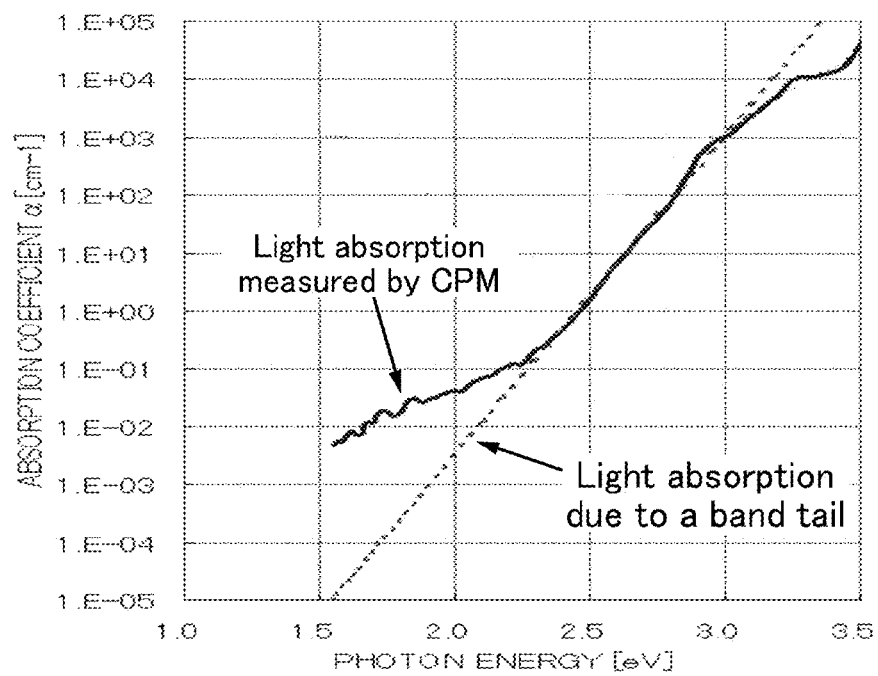
FIGS. 7A and 7B are graphs showing a light absorption spectrum in an In—Ga—Zn—O film and a light absorption spectrum of a defect level in the film, respectively.
Figure 7B:
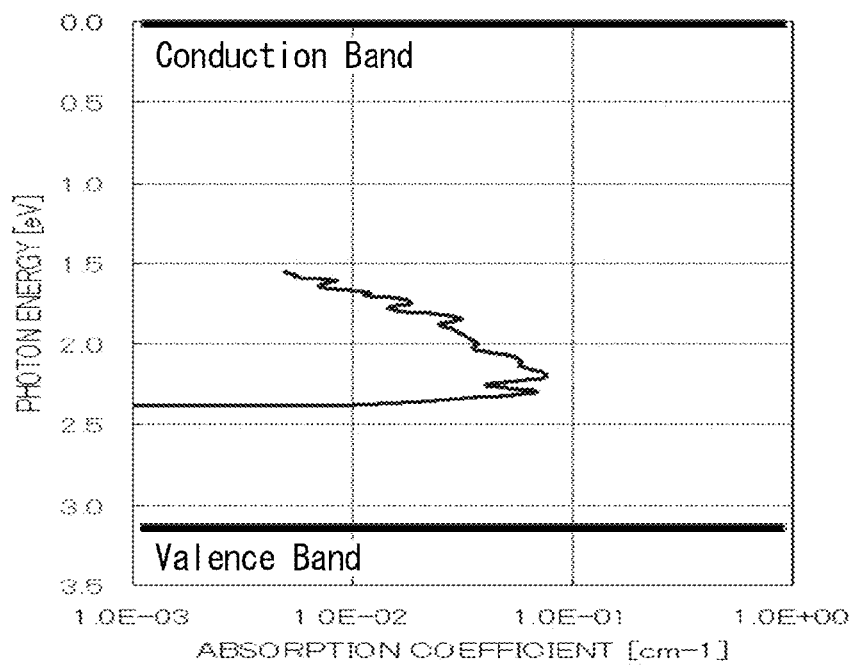

FIG. 7A shows a light absorption spectrum measured using the In—Ga—Zn—O film for the sample 210. Light absorption (an urbach tail) due to a band tail is removed from a curve of a light absorption spectrum in FIG. 7A, whereby light absorption due to a defect level can be made apparent as shown in FIG. 7B.

Moreover, the light absorption (urbach tail) due to the band tail is removed from the curve of the light absorption spectrum, whereby an absorption coefficient α due to the defect level can be calculated from Formula (1) below.

$$\alpha = \int \frac{\alpha(E) - \alpha_u}{E} dE \qquad \text{[Formula 1]}$$

Here, α(E) represents the absorption coefficient at each energy level and $\alpha_u$ represents the absorption coefficient due to the urbach tail.

Note that the slope of the urbach tail is called urbach energy. As the urbach energy gets smaller, such a semiconductor layer is a well-ordered semiconductor layer which has fewer defects and whose tail slope of a level at a band edge in the valence band becomes steeper.

Figure 21A:
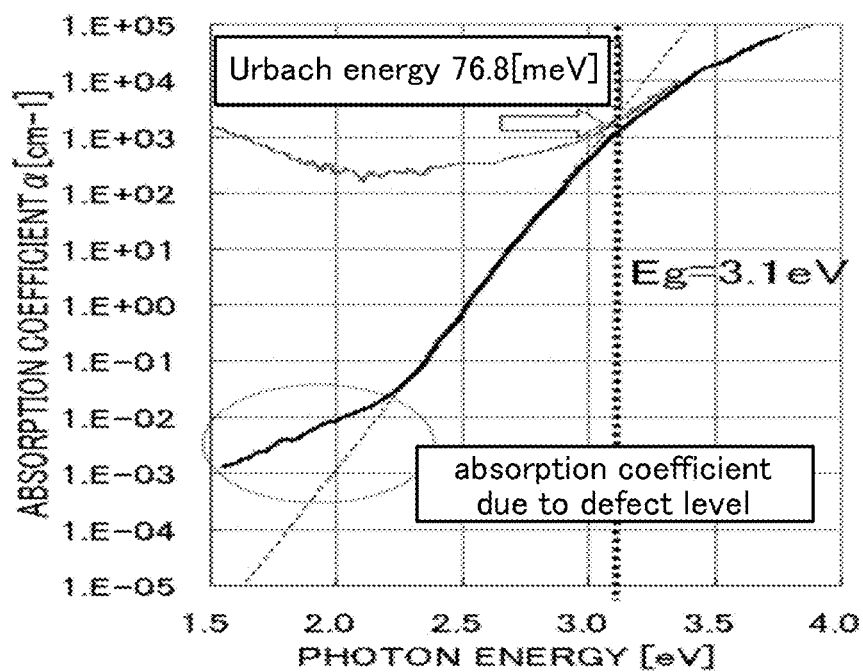
FIGS. 21A and 21B are graphs each showing a light absorption spectrum of an In—Ga—Zn—O film.
Figure 21B:
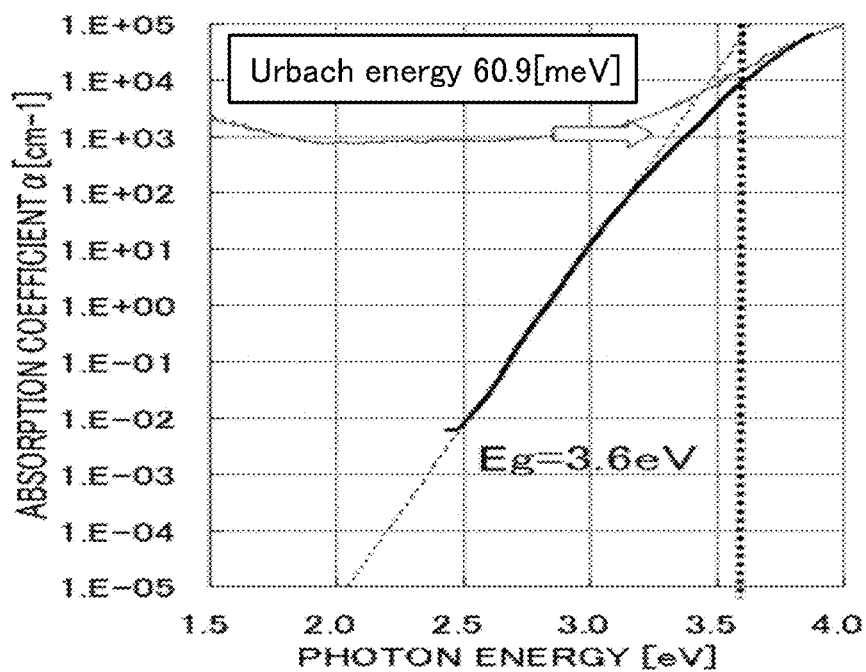

For example, FIG. 21A shows the CPM measurement result of an In—Ga—Zn—O film whose atomic ratio of In to Ga and Zn is 1:1:1 and the urbach energy is 76.8 meV. On the other hand, FIG. 21B shows the CPM measurement result of an In—Ga—Zn—O film whose atomic ratio of In to Ga and Zn is 1:3:2 and the urbach energy is 69.0 meV. The comparison between these two In—Ga—Zn—O films shows that the In—Ga—Zn—O film whose atomic ratio of In to Ga and Zn is 1:3:2 has fewer defects.

Figure 25A:
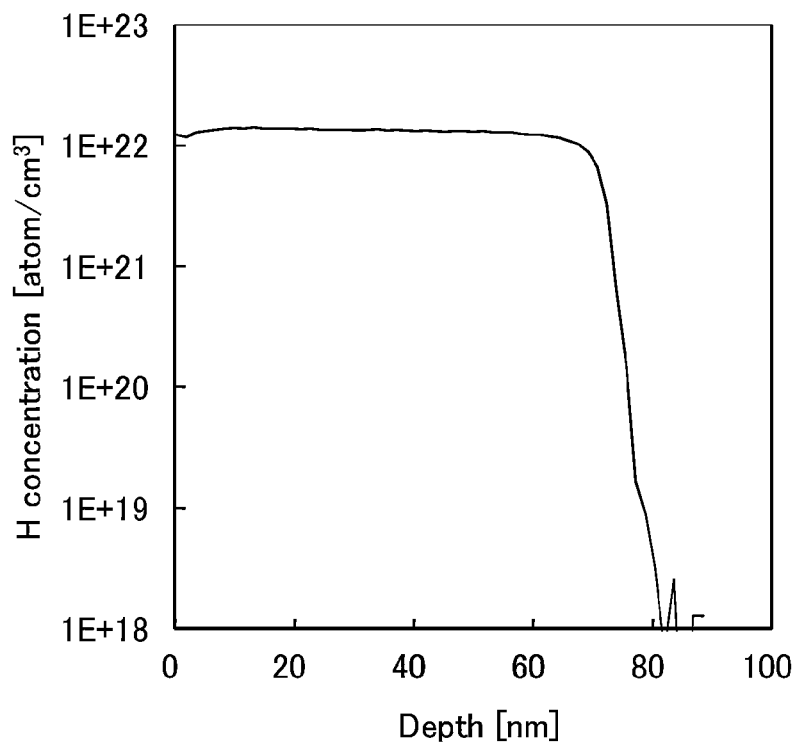
FIG. 25A is a graph showing a SIMS analysis result of an In—Ga—Zn—O film having a high content of hydrogen and FIG. 25B is a graph showing a CPM measurement result thereof.
Figure 25B:
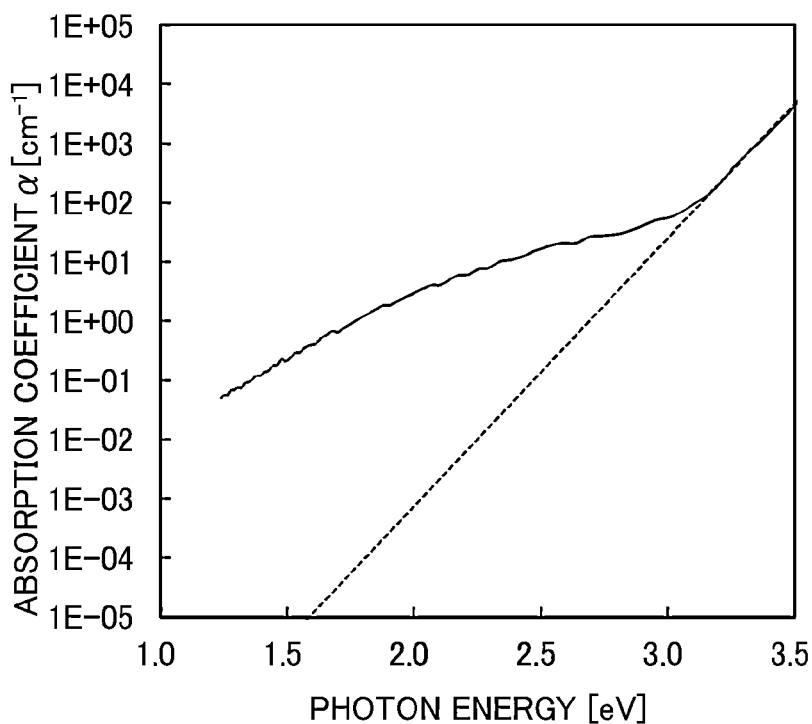

Note that it is found that an In—Ga—Zn—O film having a high content of hydrogen has high light absorption due to defects. FIG. 25A shows a SIMS analysis result of an In—Ga—Zn—O film having a high content of hydrogen and FIG. 25B shows a CPM measurement result of the In—Ga—Zn—O film. In the film having a high content of hydrogen, extremely high light absorption due to defects is observed.

It can be said that crystallinity is strongly related to the defects in the above In—Ga—Zn—O film having a high content of hydrogen. The result of calculation of the content of hydrogen and crystallinity of an In—Ga—Zn—O film is described next.

Figure 26A:
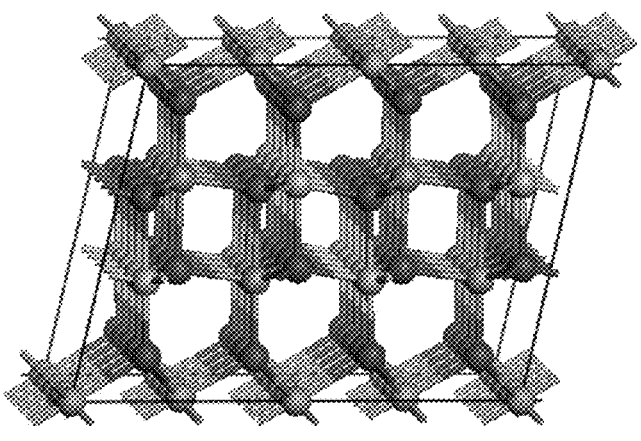
FIGS. 26A to 26C are diagrams illustrating models used for calculation of the content of hydrogen and crystallinity of an In—Ga—Zn—O film.
Figure 26B:
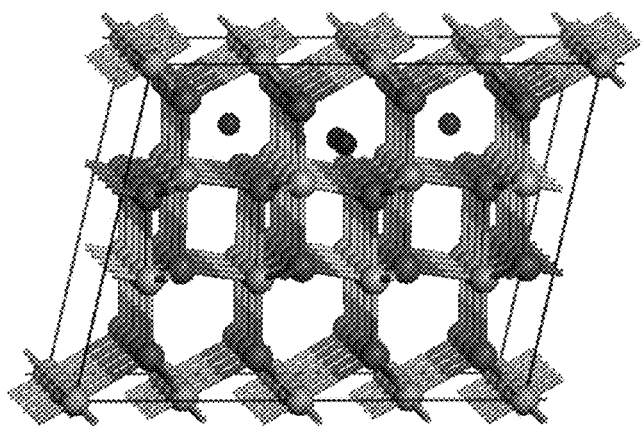
Figure 26C:
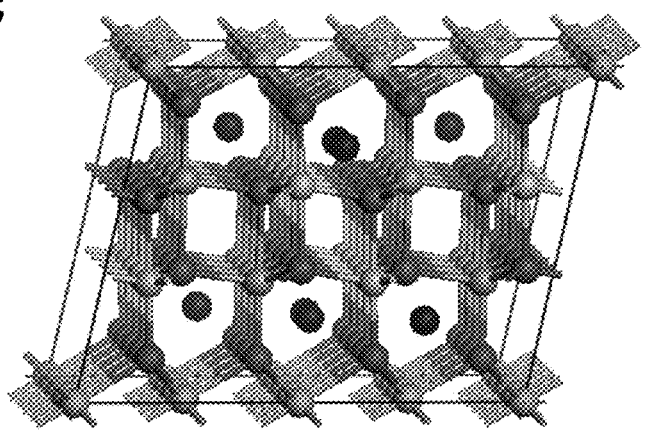

FIGS. 26A to 26C illustrate models used for the calculation. In—Ga—Zn—O crystal models each including 112 atoms are used, and Ga and Zn are disposed between two layers of InO$_2$. The vertical direction of each figure represents the c-axis, and the In—Ga—Zn—O crystal model not containing hydrogen, the In—Ga—Zn—O crystal model in which the content of hydrogen is 3.45 atom %, and the In—Ga—Zn—O crystal model in which the content of hydrogen is 6.67 atom % are used as shown in FIG. 26A, FIG. 26B, and FIG. 26C, respectively.

A supercomputer was used for the calculation, and the calculation was performed under the conditions shown in Table 1.

TABLE 1

| | |
|---|---|
| Software | VASP |
| Pseudopotential | PAW |
| Exchange correlation | GGA/PBE |
| Cut-off energy | 500 eV |
| K-point grid | 1 × 1 × 1 |
| Ensemble | NVT (constant in number of particles, volume, and temperature) |
| Temperature | 2100 K to 2700 K |
| Δt | 1.0 fsec |
| Calculation time | 10.0 psec |

Figure 27A:
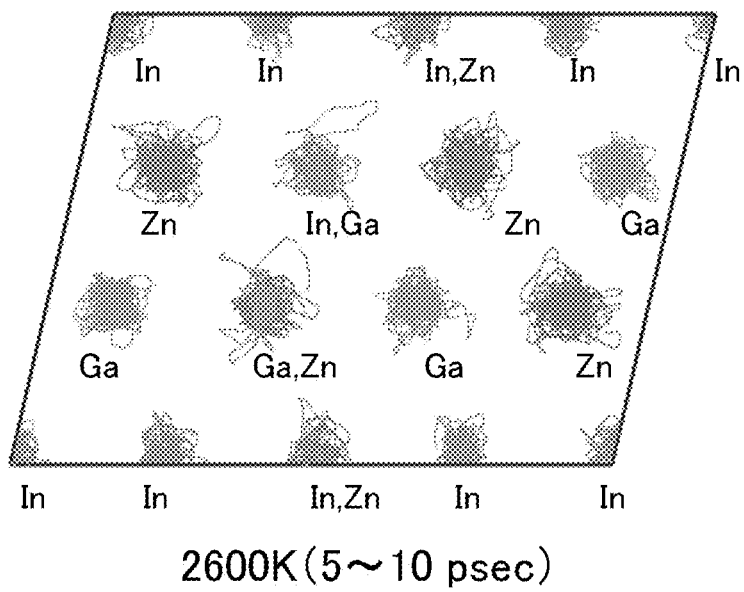
FIGS. 27A and 27B are diagrams illustrating trajectories of atoms at 2600 K and 2700 K, respectively, which are each obtained by calculation with an In—Ga—Zn—O crystal model not containing hydrogen.
Figure 27B:
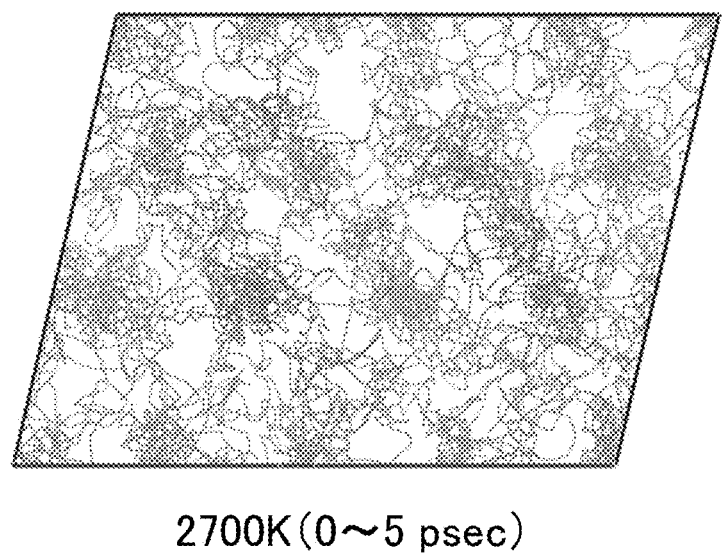
Figure 28:
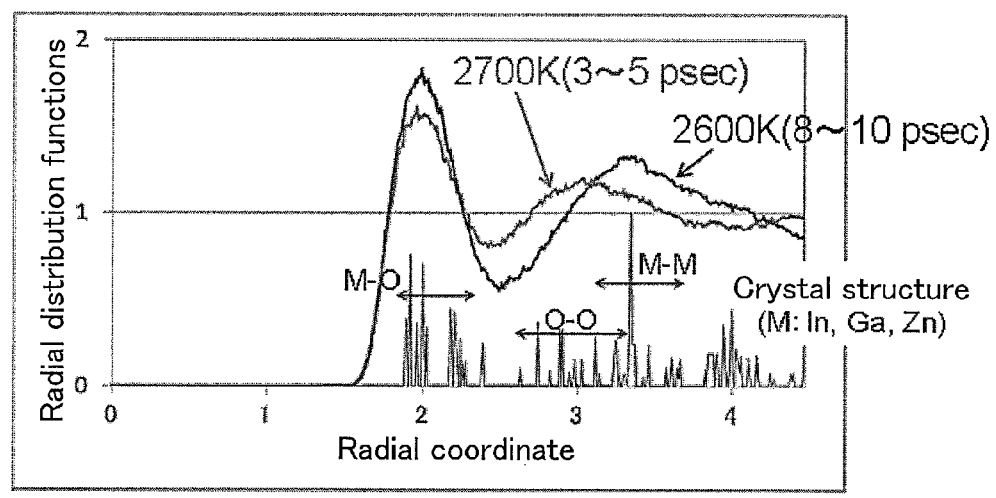
FIG. 28 is a graph showing a radial distribution function of an In—Ga—Zn—O film.

FIGS. 27A and 27B illustrate trajectories of the atoms at 2600 K and 2700 K, respectively, which are each obtained by the calculation with the In—Ga—Zn—O crystal model not containing hydrogen. FIG. 28 is a graph showing radial distribution functions of an InGaZnO$_4$ crystal and radial distribution functions of the above models.

Maintenance or destroy of the crystal structure can be evaluated by the radial distribution functions in FIG. 28, and destroy of the crystal structure can be determined when a peak at about 0.34 nm (mainly M-M) is shifted to a short distance side with a broader peak. Table 2 shows the result of maintenance or destroy of the crystal structure which is determined from the radial distribution function of each model.

TABLE 2

| | Content of hydrogen | | |
|---|---|---|---|
| Temperature | None | 3.45 atom % | 6.67 atom % |
| 2100 K | — | — | ○ |
| 2200 K | — | — | ○ |
| 2300 K | — | — | X |
| 2400 K | — | ○ | — |
| 2500 K | — | X | — |
| 2600 K | ○ | — | — |
| 2700 K | X | — | — |

(○: maintenance of crystal structure, X: destroy of crystal structure, —: uncalculated)

The result of Table 2 shows that the crystal structure is destroyed at a lower temperature as the hydrogen content of the film gets higher and, whereas crystallinity can be maintained more easily as the hydrogen content of the film gets lower.

Figure 29A:
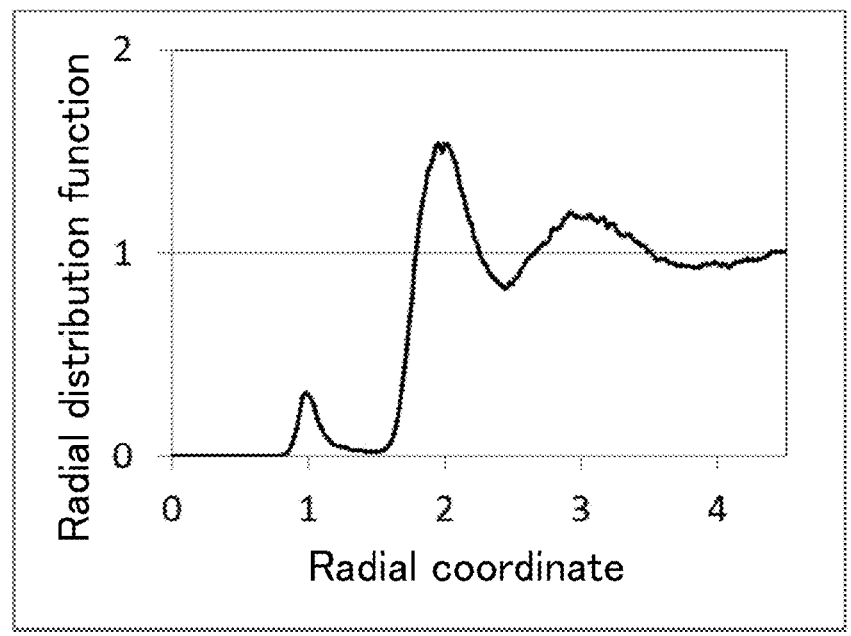
FIG. 29A is a graph showing a radial distribution function of an In—Ga—Zn—O crystal model in which the content of hydrogen is 3.45 atom %
Figure 29B:
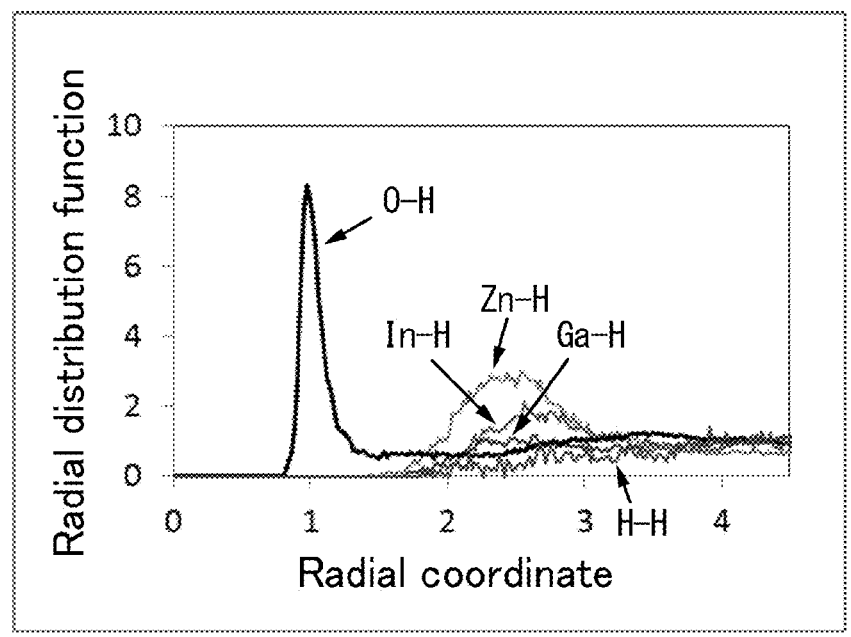
FIG. 29B is a graph showing a radial distribution function of hydrogen.

FIG. 29A shows a radial distribution function of the In—Ga—Zn—O crystal model in which the content of hydrogen is 3.45 atom % and the crystal structure is destroyed at 2500 K, and FIG. 29B shows a radial distribution function of hydrogen. As shown in FIG. 29B, most of hydrogen atoms are bonded to oxygen atoms.

Next, an activation barrier with respect to a free energy at the formation of a crystal nucleus is described. The amount of change ΔG in a Gibbs free energy needed at the formation of a uniform nucleus is expressed by Formula (2). Here, r denotes a radius of a nucleus, v denotes the volume of an atom, Δμ denotes a difference in a free energy per unit volume between before and after a change of a phase (Δμ=($E_{amo}/V_{amo}$)−($E_{cry}/V_{cry}$)), and σ denotes an energy of an interface between an amorphous phase and a crystal phase per unit area.

$$\Delta G = -\frac{4}{3}\pi r^3 \frac{1}{v}\Delta\mu + 4\pi r^2 \sigma \quad \text{[Formula 2]}$$

A critical nucleus radius r=2σv/Δμ at which a nucleus is formed is employed, whereby Formula (2) can be transformed into Formula (3), which shows a free energy for formation of the critical nucleus.

$$G^* = \frac{16\pi\sigma^3 v^2}{3(\Delta\mu)^2} \quad \text{[Formula 3]}$$

According to Formula (3), a free energy barrier at the formation of a nucleus becomes higher as Δμ gets smaller. Unit time and a formation frequency of a crystal nucleus in a unit volume are expressed by Formula (4).

$$J \propto \exp\left(-\frac{\Delta G^*}{kT}\right) \quad \text{[Formula 4]}$$

Thus, an activation barrier ΔG* of the free energy becomes higher and a formation frequency J of a nucleus becomes lower as Δμ gets smaller or σ gets larger.

A crystal structure and an amorphous structure of In—Ga—Zn—O are obtained in such a manner that energy of the crystal structure is approximated to free energy thereof and energy of the amorphous structure is approximated to free energy thereof by the first principles calculation, and Δμ can be obtained by the energy difference. The In—Ga—Zn—O crystal model not containing hydrogen and the In—Ga—Zn—O crystal model in which the content of hydrogen is 6.67 atom % are used, the lattice constant and the atomic coordinates of each model are optimized, and energy thereof is calculated. Then, the structures of the two models which are optimized are melted by quantum MD calculation, and energies thereof at 1000 K for 2 psec are obtained by another quantum MD calculation. Table 3 shows Δμ of each of the In—Ga—Zn—O crystal model not containing hydrogen and the In—Ga—Zn—O crystal model in which the content of hydrogen is 6.67 atom %. These results show that the film in which the content of hydrogen is 6.67 atom % is less likely to form a nucleus, that is, the film is less likely to be crystallized than the film not containing hydrogen.

TABLE 3

| | Content of hydrogen | |
|---|---|---|
| | None | 6.67 atom % |
| Δμ [ev/Å$^3$] | 0.0145 (20) | 0.0060 (22) |

Figure 1B:
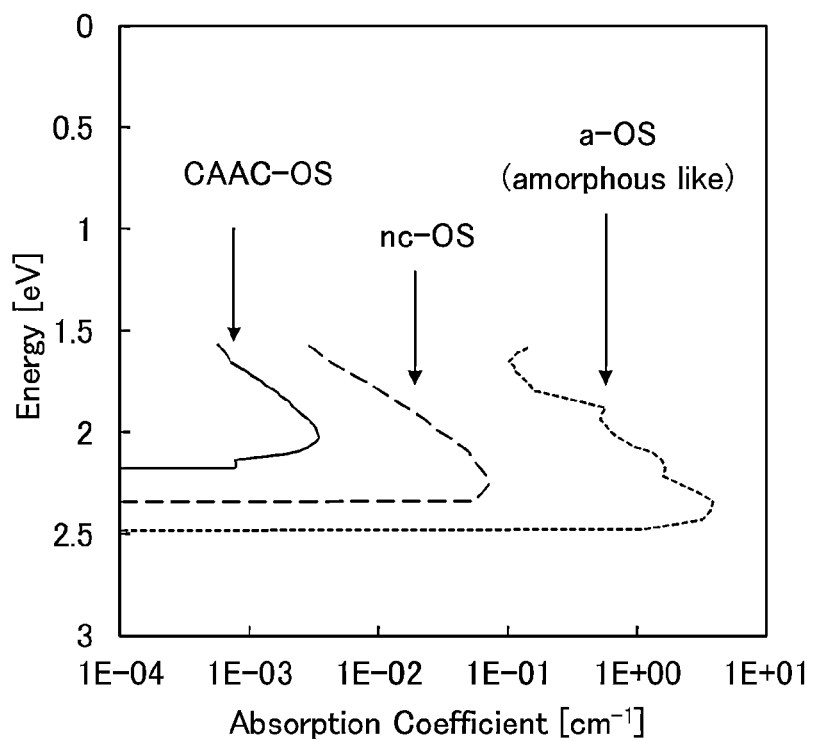

FIG. 1A shows CPM measurement results of a CAAC-OS film, a nc-OS film, and an amorphous OS film each using In—Ga—Zn—O as a material, and FIG. 1B is a graph in which light absorption of each film due to localized level is made apparent by the above method. These results show that, the absorption due to a defect level was the lowest in the CAAC-OS film, and the absorption becomes higher as the crystal structure is broken and get closer to an amorphous state. Note that absorption coefficients α due to a defect level which were calculated by the above formula were $5.3 \times 10^{-1}$/cm, $1.8 \times 10^{-2}$/cm, and $5.9 \times 10^{-4}$/cm in the amorphous OS film, the nc-OS film, and the CAAC-OS film, respectively.

As apparent from the experiment results, in the transistor including a film in which an absorption coefficient α due to a defect level is low, such as the above CAAC-OS film, it is preferable that negative-bias stress photodegradation be small and the absorption coefficient α be lower than or equal to $5 \times 10^{-2}$/cm.

In an actual transistor, not only defect levels in In—Ga—Zn—O but also defect levels in a gate insulating film largely affect the negative-bias stress photodegradation. For example, for the gate insulating film, a silicon oxide film or a silicon nitride film formed by a chemical vapor deposition (CVD) method can be used. Here, a defect level itself in a gate insulating film and a band diagram when the gate insulating film is in contact with In—Ga—Zn—O are described.

Defects of silicon oxide (e.g., $SiO_2$) are discussed in the research on silica glass used for an optical fiber. Well-known defects in silicon oxide are an E' center and a non bridging oxygen hole center (NBOHC). With a particular focus on NBOHC, the level of NBOHC was calculated by first-principle calculation. NBOHC is generated by cutting a bond of hydrogen contained in silicon oxide (i.e., Si—O—H becomes Si—O..H). The calculation was performed using CASTEP, a first-principle calculation program using density functional theory (Accelrys Software Inc.). As the conditions, a plane-wave basis, an ultrasoft pseudopotential, and a GGA-PBE functional were used.

Figure 8:
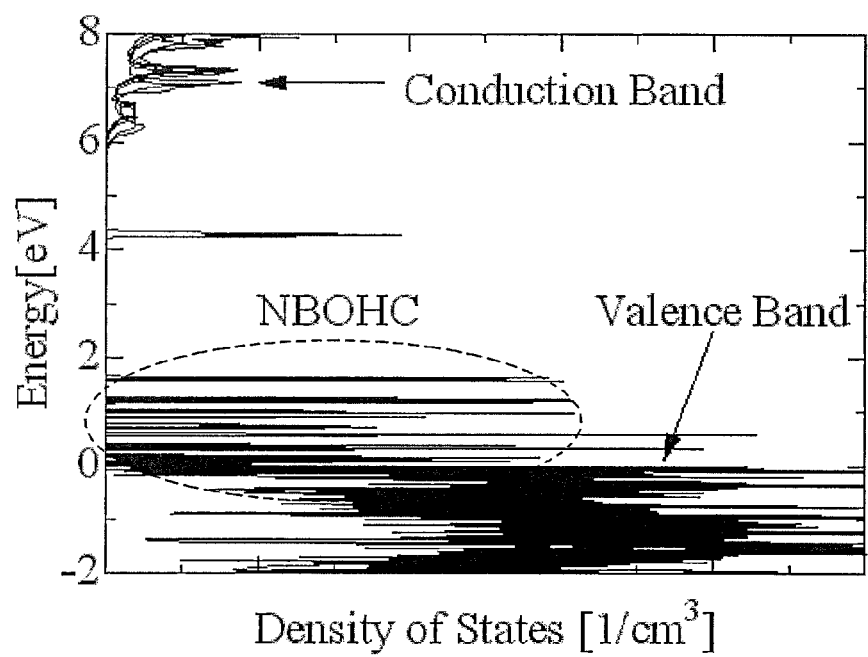
FIG. 8 is a graph showing DOS in silicon oxide.

FIG. 8 shows DOS of silicon oxide obtained by the calculation. It is found that a defect level of the above-described NBOHC is located at a deep level on the valence band side.

Next, a band gap and an ionization potential of In—Ga—Zn—O were measured by ellipsometry and ultraviolet photoelectron spectroscopy (UPS). The measured values of the band gap and the ionization potential were 3.1 eV and 7.8 eV, respectively.

Figure 9:
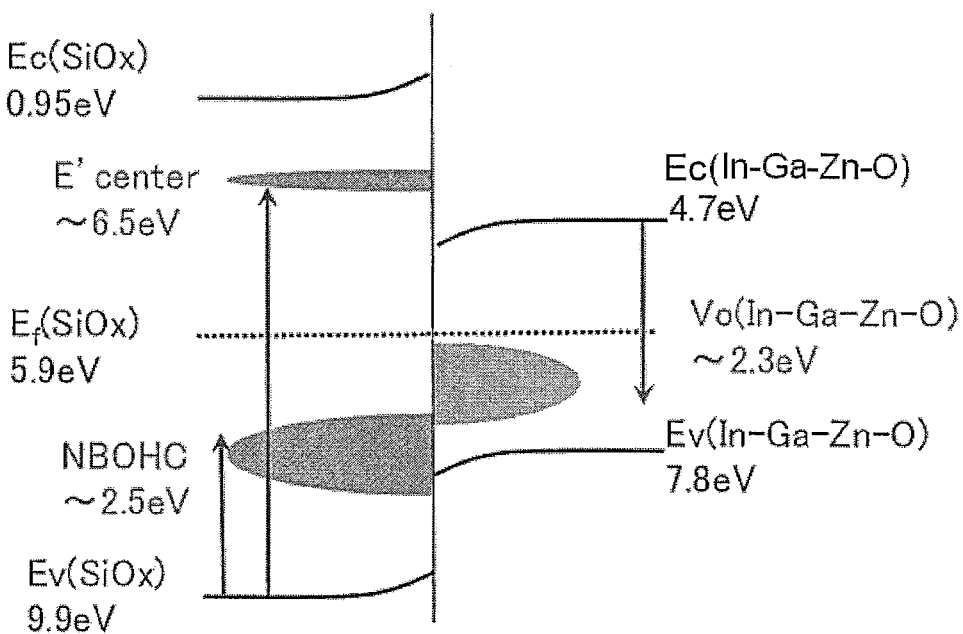
FIG. 9 is a graph showing a band diagram of In—Ga—Zn—O and silicon oxide.

The band diagrams of the In—Ga—Zn—O and silicon oxide were estimated from the measured value of the In—Ga—Zn—O, the calculated value of silicon oxide, and the like, and the results thereof are shown in FIG. 9. In FIG. 9, the above defect level due to oxygen vacancies (Vo) of the In—Ga—Zn—O and the like and the above defect levels of the E' center and the NBOHC of silicon oxide are also shown. In FIG. 9, Ev and Ec denote a valence band maximum and a conduction band minimum, respectively, and each correspond to an energy value from the vacuum level. It is assumed that when the In—Ga—Zn—O and silicon oxide are in contact with each other, the Fermi level of each film is located at the center of the band gap. Note that in practice, the In—Ga—Zn—O is likely to become n-type; therefore, in some cases, the Fermi level of the In—Ga—Zn—O is located on the conduction band side.

As shown in FIG. 9, the defect levels of the In—Ga—Zn—O and silicon oxide are located at deep levels of the valence bands which are extremely close to each other in energy. With such a band diagram, a model regarding the negative-bias stress photodegradation of the transistor including the In—Ga—Zn—O can be constructed as follows.

First, by light irradiation, an electron-hole is generated in the In—Ga—Zn—O (an active layer of the transistor). Next, the generated hole is trapped in a deep defect level in the In—Ga—Zn—O which is derived from an oxygen vacancy. Then, by application of a negative bias, the trapped hole is injected into a defect level in NBOHC in silicon oxide (the gate insulating film of the transistor). After that, the injected hole serves as a fixed charge having a positive charge in silicon oxide, thereby changing threshold voltage of the transistor.

The following three elements can be derived from the above model: generation of a hole by light irradiation, a defect level in the In—Ga—Zn—O, and a defect level in silicon oxide. When these elements interact with one another, the threshold voltage of the transistor can be changed.

In consideration of the above elements, it is found that negative-bias stress photodegradation can be suppressed effectively in such a manner that a CAAC-OS film of an In—Ga—Zn—O having a low density of a defect level which is derived from oxygen vacancies is used for the active layer of the transistor and a film of silicon oxide in which the content of hydrogen is small is used for a gate insulating film.

Figure 10A:
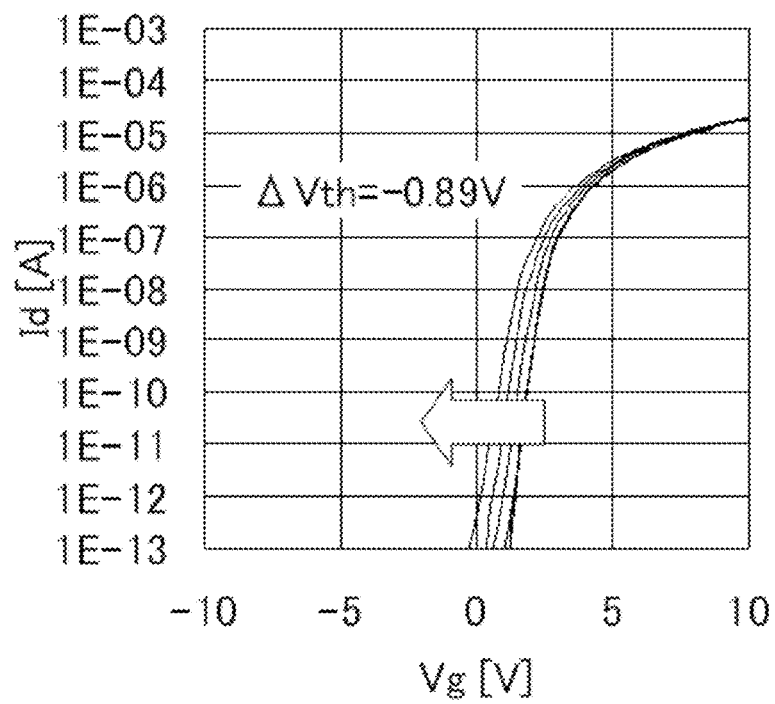
FIGS. 10A and 10B are graphs showing results of negative bias photostress tests.
Figure 10B:
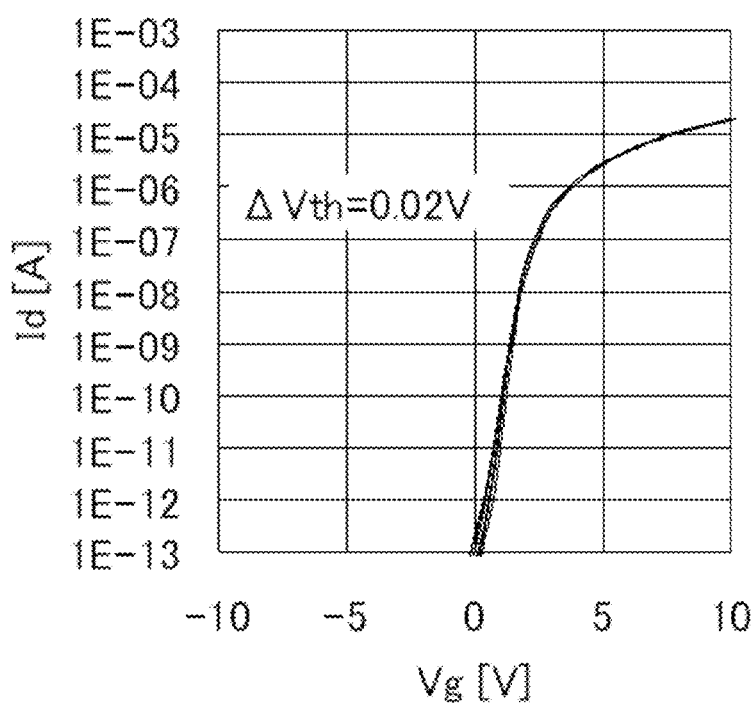

FIGS. 10A and 10B show comparison results of negative bias photostress tests of transistors in each of which the In—Ga—Zn—O CAAC-OS film is used for an active layer and a silicon oxide film having a different content of hydrogen is used for a gate insulating film. The negative bias photostress test was performed under conditions where the stress voltage Vg was −30 V, the stress temperature was 80° C., the stress time was 2000 sec, and irradiation with white LED light of 3000 1x was performed.

FIG. 10A shows Id-Vg characteristics between before and after the stress test of a transistor including, as the gate insulating film, a silicon oxide film having a relatively high content of hydrogen. Such a transistor can be applied to a transistor such as a transistor in which polysilicon is used for an active layer. It is found that the threshold voltage is shifted in the negative direction between before and after the stress. Note that in the case where an In—Ga—Zn—O amorphous film is used as the active layer, the threshold voltage is further largely shifted in the negative direction. On the other hand, FIG. 10B shows Id-Vg characteristics between before and after the stress test of a transistor including, as the gate insulating film, a silicon oxide film in which the content of hydrogen is reduced as much as possible by devising a film formation process. This result shows that the threshold voltage is hardly changed between before and after the stress.

In this manner, negative-bias stress photodegradation can be reduced in such a manner that the In—Ga—Zn—O CAAC-OS film is used, the hydrogen content of the silicon oxide film which is used as the gate insulating film is reduced, and the number of NBOHC that forms a deep level on the valence band side is reduced.

Figure 11A:
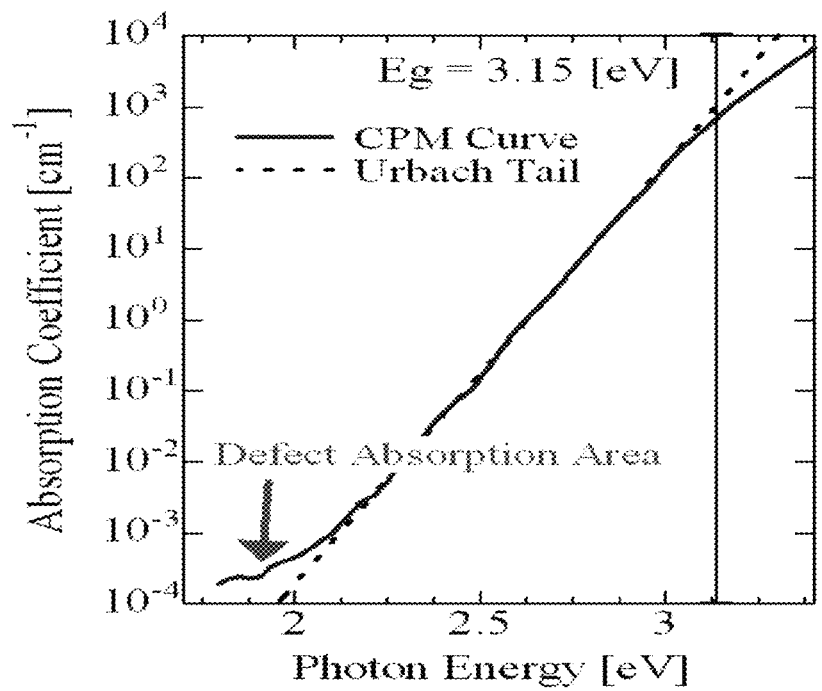
FIGS. 11A and 11B are graphs showing a light absorption spectrum in an In—Ga—Zn—O film and a light absorption spectrum of a defect level in the film, respectively.
Figure 11B:
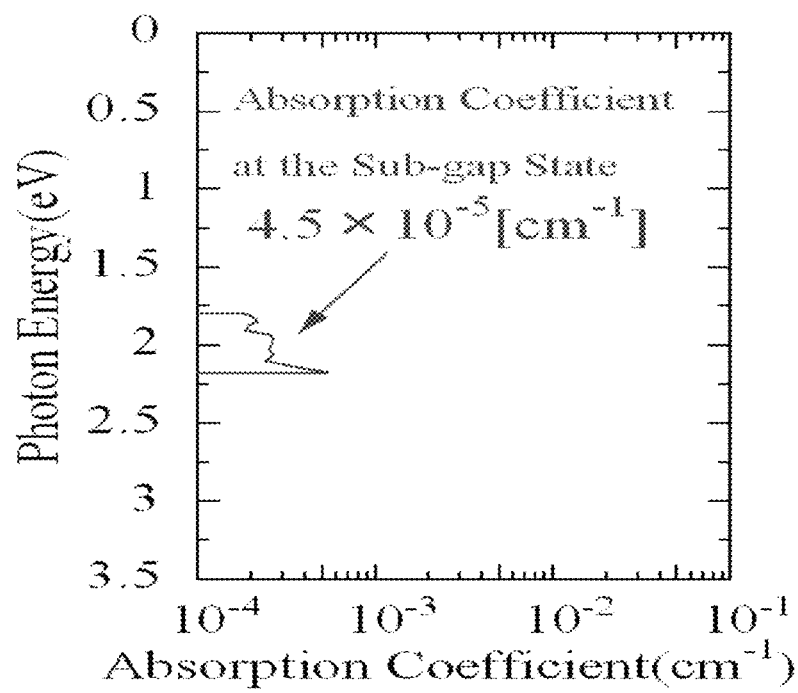

Defects in the In—Ga—Zn—O CAAC-OS film can be reduced as much as possible. FIG. 11A is a CPM measurement result of a CAAC-OS film in which the number of defects is extremely small, and FIG. 11B is a calculation result of an absorption coefficient of a defect level of the CAAC-OS film. In the CAAC-OS film, light absorption is mainly due to an urbach tail that is a delocalized level, and an absorption coefficient of a defect level that can be slightly observed is as low as $4.5\times10^{-5}/\text{cm}$.

Figure 12:
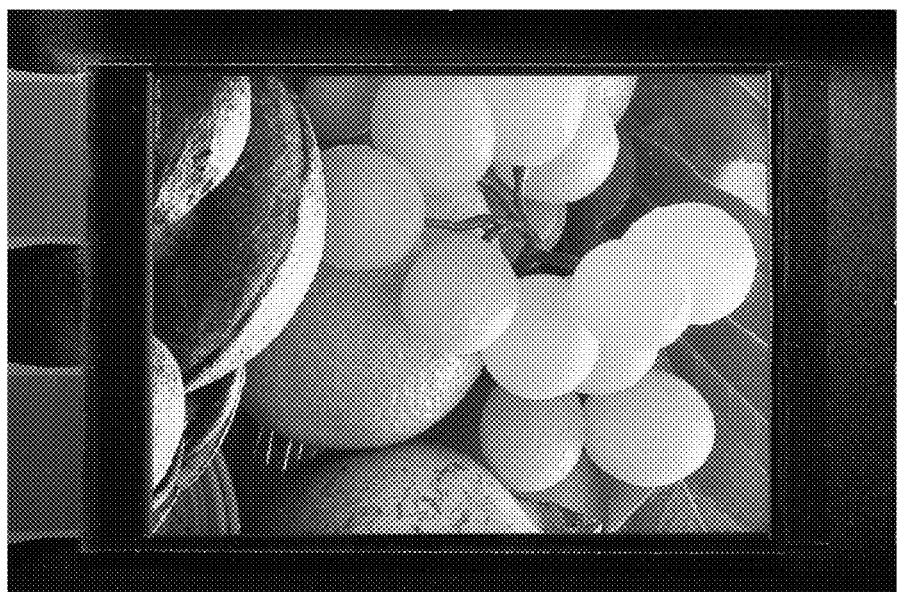
FIG. 12 is a photograph of an active matrix liquid crystal display.

When such a CAAC-OS film in which the density of defect levels in a band gap are greatly decreased is used for an active layer of a transistor, the negative-bias stress photodegradation can be reduced, and other characteristics including reliability can be improved. With the use of the transistor including the CAAC-OS film as a switching element, a high-resolution active matrix liquid crystal display like that in a photograph in FIG. 12 can be manufactured.

As described in this embodiment, the defect level of the In—Ga—Zn—O film which was obtained by the measurement of optical properties and the defect level in silicon oxide which was obtained by theoretical calculation are extremely close to each other in energy. Therefore, regarding the negative-bias stress photodegradation of the transistor, the model including the three elements, a hole generated by light irradiation, a defect level of the In—Ga—Zn—O film, and a defect level of the silicon oxide film, was constructed. As described above, a transistor which has small negative-bias stress photodegradation can be manufactured in such a manner that the CAAC-OS film with few defects is used for the active layer, the hydrogen content of the silicon oxide film is reduced, and the number of NBOHC which is one of defects is reduced. Accordingly, it can be confirmed that the above model is appropriate.

Note that this embodiment can be combined as appropriate with any of the other embodiments and an example in this specification.

Embodiment 2

In this embodiment, a semiconductor device to which the CAAC-OS film described in Embodiment 1 can be applied will be described with reference to drawings.

Figure 13A:
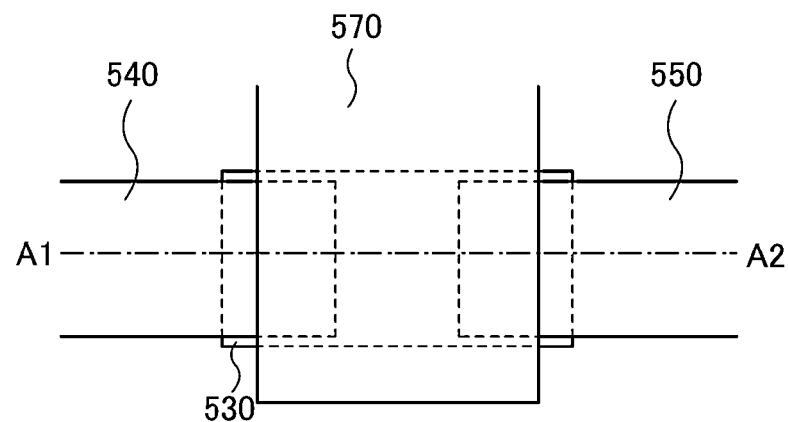
FIG. 13A is a top view illustrating a semiconductor device and FIG. 13B is a cross-sectional view thereof.
Figure 13B:
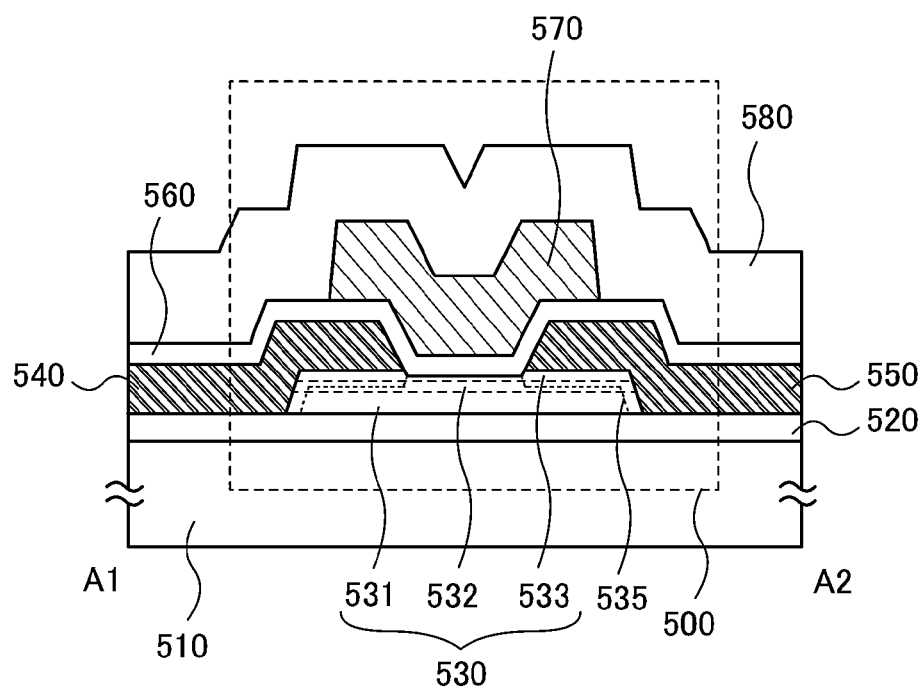

FIGS. 13A and 13B are a top view and a cross-sectional view which illustrate a transistor of one embodiment of the present invention. FIG. 13A is the top view, and a cross section taken along dashed-dotted line A1-A2 in FIG. 13A is illustrated in FIG. 13B. Note that for simplification of the drawing, some components in the top view in FIG. 13A are not illustrated. In some cases, the direction of the dashed-dotted line A1-A2 is referred to as a channel length direction.

A transistor 500 in FIGS. 13A and 13B includes a base insulating film 520 formed over a substrate 510; an oxide semiconductor layer 530 formed over the base insulating film 520; a source electrode 540 and a drain electrode 550 formed over the oxide semiconductor layer 530; a gate insulating film 560 formed over the source electrode 540 and the drain electrode 550, and the oxide semiconductor layer 530; and a gate electrode 570 formed over the gate insulating film 560. Further, an oxide insulating layer 580 may be formed over the gate insulating film 560 and the gate electrode 570. Note that the oxide insulating layer 580 may be provided as needed and another insulating layer may be further provided thereover.

Note that functions of a "source" and a "drain" of a transistor are sometimes replaced with each other when a transistor of opposite polarity is used or when the direction of current flowing is changed in circuit operation, for example. Therefore, the terms "source" and "drain" can be used to denote the drain and the source, respectively, in this specification.

The substrate 510 is not limited to a simple supporting substrate, and may be a substrate where a device such as a transistor is formed. In that case, at least one of the gate electrode 570, the source electrode 540, and the drain electrode 550 of the transistor 500 may be electrically connected to the above device.

The base insulating film 520 can have a function of supplying oxygen to the oxide semiconductor layer 530 as well as a function of preventing diffusion of an impurity from the substrate 510; thus, the base insulating film 520 is preferably an insulating film containing oxygen, further preferably an insulating film containing excess oxygen. Note that in the case where the substrate 510 is a substrate where another device is formed as described above, the base insulating film 520 has also a function as an interlayer insulating film. In that case, the base insulating film 520 is preferably subjected to planarization treatment such as chemical mechanical polishing (CMP) treatment so as to have a flat surface.

Further, the oxide semiconductor layer 530 has a structure in which a first oxide semiconductor layer 531, a second oxide semiconductor layer 532, and a third oxide semiconductor layer 533 are stacked in this order from the substrate 510 side. Here, for the second oxide semiconductor layer 532, for example, an oxide semiconductor whose electron affinity (an energy difference between a vacuum level and a conduction band minimum) is higher than those of the first oxide semiconductor layer 531 and the third oxide semiconductor layer 533 is used. The electron affinity can be obtained by subtracting an energy difference between the conduction band minimum and a valence band maximum (what is called an energy gap) from an energy difference between the vacuum level and the valence band maximum (what is called an ionization potential).

Although the case where the oxide semiconductor layer 530 is a stack of three layers is described in this embodiment, the oxide semiconductor layer 530 may be a single layer or a stack of two layers or four or more layers. In the case of a single layer, for example, a layer corresponding to the second oxide semiconductor layer 532 is used. In the case of the two-layer stacked structure, for example, a structure in which a layer corresponding to the second oxide semiconductor layer 532 is provided on the substrate 510 side and a layer corresponding to the first oxide semiconductor layer 531 or the third oxide semiconductor layer 533 is provided on the gate insulating film 560 side or a structure in which a layer corresponding to the first oxide semiconductor layer 531 or the third oxide semiconductor layer 533 is provided on the substrate 510 side and a layer corresponding to the second oxide semiconductor layer 532 is provided on the gate insulating film 560 side may be employed. In the case of the stacked-layer structure of four or more layers, for example, a structure in which another oxide semiconductor layer is stacked over the three-layer stack described in this embodiment or a structure in which another oxide semiconductor layer is inserted in any one of the interfaces in the three-layer stack can be employed.

The first oxide semiconductor layer 531 and the third oxide semiconductor layer 533 each contain one or more kinds of metal elements contained in the second oxide semiconductor layer 532. For example, the first oxide semiconductor layer 531 and the third oxide semiconductor layer 533 are preferably formed using an oxide semiconductor whose energy of the conduction band minimum is closer to a vacuum level than that of the second oxide semiconductor layer 532 by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the gate electrode 570, a channel is formed in the second oxide semiconductor layer 532 of the oxide semiconductor layer 530, whose energy of the conduction band minimum is the lowest. In other words, the third oxide semiconductor layer 533 is formed between the second oxide semiconductor layer 532 and the gate insulating film 560, whereby a structure in which the channel of the transistor is not in contact with the gate insulating film 560 can be obtained.

Further, since the first oxide semiconductor layer 531 contains one or more kinds of metal elements contained in the second oxide semiconductor layer 532, an interface state is less likely to be formed at the interface between the second oxide semiconductor layer 532 and the first oxide semiconductor layer 531. The interface state sometimes forms a channel; therefore, the threshold voltage of the transistor is changed in some cases. Thus, with the first oxide semiconductor layer 531, fluctuation in electrical characteristics of the transistors, such as a threshold voltage, can be reduced.

Furthermore, since the third oxide semiconductor layer 533 contains one or more kinds of metal elements contained in the second oxide semiconductor layer 532, scattering of carriers is less likely to occur at the interface between the second oxide semiconductor layer 532 and the third oxide semiconductor layer 533. Therefore, with the third oxide semiconductor layer 533, the field-effect mobility of the transistor can be increased.

For the first oxide semiconductor layer 531 and the third oxide semiconductor layer 533, for example, a material containing much Al, Ti, Ga, Ge, Y, Zr, Sn, La, Ce, or Hf in an atomic ratio than a material of the second oxide semiconductor layer 532 can be used. Specifically, any of the above metal elements in an atomic ratio 1.5 times or more, preferably 2 times or more, further preferably 3 times or more as much as a metal element of the second oxide semiconductor layer 532 is contained. Any of the above metal elements is strongly bonded to oxygen and thus has a function of suppressing generation of an oxygen vacancy in the first oxide semiconductor layer 531 and the third oxide semiconductor layer 533. That is, an oxygen vacancy is less likely to be generated in the first oxide semiconductor layer 531 and the third oxide semiconductor layer 533 than in the second oxide semiconductor layer 532.

Note that when each of the first oxide semiconductor layer 531, the second oxide semiconductor layer 532, and the third oxide semiconductor layer 533 is an In-M-Zn oxide containing at least indium, zinc, and M (M is a metal such as Al, Ti, Ga, Ge, Y, Zr, Sn, La, Ce, or Hf), and the first oxide semiconductor layer 531 has an atomic ratio of In to M and Zn which is $x_1:y_1:z_1$, the second oxide semiconductor layer 532 has an atomic ratio of In to M and Zn which is $x_2:y_2:z_2$, and the third oxide semiconductor layer 533 has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, more preferably three times or more as large as $y_2/x_2$. At this time, when $y_2$ is greater than or equal to $x_2$ in the second oxide semiconductor layer 532, a transistor can have stable electrical characteristics. However, when $y_2$ is 3 times or more as large as $x_2$, the field-effect mobility of the transistor is reduced; accordingly, $y_2$ is preferably smaller than 3 times $x_2$.

Moreover, without taking Zn and O into consideration, the atomic percentage of In and the atomic percentage of M in the first oxide semiconductor layer 531 and the third oxide semiconductor layer 533 are preferably less than 50 atomic % and greater than or equal to 50 atomic %, respectively, and further preferably less than 25 atomic % and greater than or equal to 75 atomic %, respectively. Moreover, without taking Zn and O into consideration, the atomic percentage of In and the atomic percentage of M in the second oxide semiconductor layer 532 are preferably greater than or equal to 25 atomic % and less than 75 atomic %, respectively, and further preferably greater than or equal to 34 atomic % and less than 66 atomic %, respectively.

The thickness of each of the first oxide semiconductor layer 531 and the third oxide semiconductor layer 533 is greater than or equal to 3 nm and less than or equal to 100 nm, preferably greater than or equal to 3 nm and less than or equal to 50 nm. The thickness of the second oxide semiconductor layer 532 is greater than or equal to 3 nm and less than or equal to 200 nm, preferably greater than or equal to 3 nm and less than or equal to 100 nm, further preferably greater than or equal to 3 nm and less than or equal to 50 nm.

For each of the first oxide semiconductor layer 531, the second oxide semiconductor layer 532, and the third oxide semiconductor layer 533, for example, an oxide semiconductor containing indium, zinc, and gallium can be used. Note that the second oxide semiconductor layer 532 preferably contains indium because carrier mobility can be increased.

Note that stable electrical characteristics can be effectively imparted to a transistor in which an oxide semiconductor layer serves as a channel by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1\times10^{17}/cm^3$, preferably lower than $1\times10^{15}/cm^3$, further preferably lower than $1\times10^{13}/cm^3$.

Further, in an oxide semiconductor layer, hydrogen, nitrogen, carbon, silicon, and metal elements except main components of the oxide semiconductor are impurities. For example, hydrogen and nitrogen form donor levels to increase the carrier density. Silicon forms impurity levels in the oxide semiconductor layer. The impurity level becomes a trap, which might deteriorate the electrical characteristics of the transistor. Therefore, it is preferable to reduce the concentration of the impurities in the first oxide semiconductor layer 531, the second oxide semiconductor layer 532, and the third oxide semiconductor layer 533 and at interfaces between the layers.

In order to make the oxide semiconductor layer intrinsic or substantially intrinsic, in secondary ion mass spectrometry (SIMS), for example, the concentration of silicon at a certain depth of the oxide semiconductor layer or in a region of the oxide semiconductor layer is lower than $1\times10^{19}$ atoms/cm$^3$, preferably lower than $5\times10^{18}$ atoms/cm$^3$, further preferably lower than $1\times10^{18}$ atoms/cm$^3$. The concentration of hydrogen at a certain depth of the oxide semiconductor layer or in a region of the oxide semiconductor layer is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$, for example. The concentration of nitrogen at a certain depth of the oxide semiconductor layer or in a region of the oxide semiconductor layer is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$, for example.

In the case where the oxide semiconductor layer includes crystals, high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer is lower than $1\times10^{19}$ atoms/cm$^3$, preferably lower than $5\times10^{18}$ atoms/cm$^3$, further preferably lower than $1\times10^{18}$ atoms/cm$^3$, for example. The concentration of carbon at a certain depth of the oxide semiconductor layer or in a region of the oxide semiconductor layer is lower than $1\times10^{19}$ atoms/cm$^3$, preferably lower than $5\times10^{18}$ atoms/cm$^3$, further preferably lower than $1\times10^{18}$ atoms/cm$^3$, for example.

A transistor in which a highly purified oxide semiconductor film is used for a channel formation region as described above has an extremely low off-state current, and the off-state current normalized on the channel width of the transistor can be as low as several yoctoamperes per micrometer to several zeptoamperes per micrometer. The voltage between the source and the drain in this case is, for example, about 0.1 V, 5 V, or 10 V.

Note that as the gate insulating film of the transistor, an insulating film containing silicon is used in many cases; therefore, it is preferable that a region of the oxide semiconductor layer, which serves as a channel, be not in contact with the gate insulating film for the above-described reason. In the case where a channel is formed at the interface between a gate insulating film and an oxide semiconductor layer, scattering of carriers occurs at the interface, whereby the field-effect mobility of a transistor is reduced in some cases. Also from the view of the above, it is preferable that a region of the oxide semiconductor layer, which serves as a channel, be separated from the gate insulating film.

Therefore, with the oxide semiconductor layer 530 having a stacked-layer structure including the first oxide semiconductor layer 531, the second oxide semiconductor layer 532, and the third oxide semiconductor layer 533, the second oxide semiconductor layer 532 where a channel of the transistor is formed can be separated from the gate insulating film; accordingly, the transistor can have a high field-effect mobility and stable electrical characteristics.

Next, the band structure of the oxide semiconductor layer 530 is described. The band structure is analyzed by forming the stack corresponding to the oxide semiconductor layer 530, in which an In—Ga—Zn oxide having an energy gap of 3.5 eV is used as a layer corresponding to each of the first oxide semiconductor layer 531 and the third oxide semiconductor layer 533 and an In—Ga—Zn oxide having an energy gap of 3.15 eV is used as a layer corresponding to the second oxide semiconductor layer 532. Note that for convenience, the stack is referred to as the oxide semiconductor layer 530, and the layers forming the stack are referred to as the first oxide semiconductor layer 531, the second oxide semiconductor layer 532, and the third oxide semiconductor layer 533.

In each of the first oxide semiconductor layer 531, the second oxide semiconductor layer 532, and the third oxide semiconductor layer 533, the thickness was 10 nm, and the energy gap was measured with the use of a spectroscopic ellipsometer (UT-300 manufactured by HORIBA Jobin Yvon S.A.S.). The energy difference between the vacuum level and the valence band maximum was measured using an ultraviolet photoelectron spectroscopy (UPS) device (VersaProbe manufactured by ULVAC-PHI, Inc.).

Figure 14A:
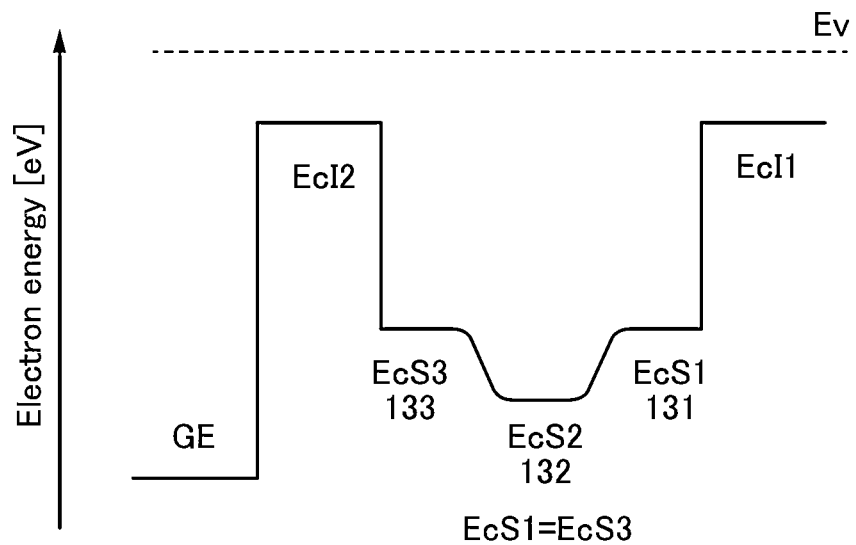
FIGS. 14A and 14B are diagrams each illustrating a band structure of oxide semiconductor layers.
Figure 14B:
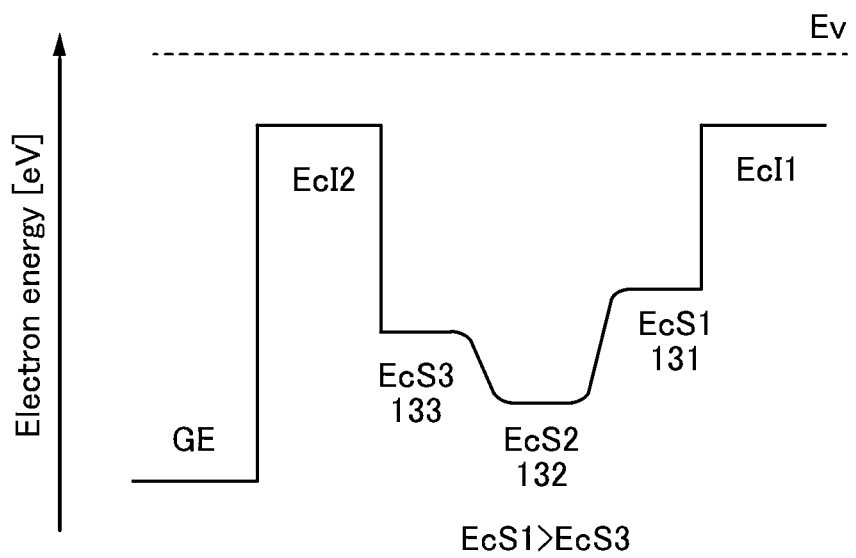

FIGS. 14A and 14B schematically show part of a band structure of an energy difference (electron affinity) between the vacuum level and the conduction band minimum of each layer, which is calculated by subtracting the energy gap of each layer from the energy difference between the vacuum level and the valence band maximum. FIG. 14A is a band diagram showing the case where a silicon oxide film is provided in contact with the first oxide semiconductor layer 531 and the third oxide semiconductor layer 533. Here, Ev represents energy of the vacuum level, EcI1 and EcI2 represent energy of the conduction band minimum of the silicon oxide film, EcS1 represents energy of the conduction band minimum of the first oxide semiconductor layer 531, EcS2 represents energy of the conduction band minimum of the second oxide semiconductor layer 532, and EcS3 represents energy of the conduction band minimum of the third oxide semiconductor layer 533. Further, in forming a transistor, a gate electrode is to be in contact with the silicon oxide film having EcI2.

As shown in FIG. 14A, the energies of the conduction band minimums of the first oxide semiconductor layer 531, the second oxide semiconductor layer 532, and the third oxide semiconductor layer 533 are changed continuously. This can be understood also from the fact that the compositions of the first oxide semiconductor layer 531, the second oxide semiconductor layer 532, and the third oxide semiconductor layer 533 are close to one another and oxygen is easily diffused among the first oxide semiconductor layer 531, the second oxide semiconductor layer 532, and the third oxide semiconductor layer 533. Therefore, the first oxide semiconductor layer 531, the second oxide semiconductor layer 532, and the third oxide semiconductor layer 533 have a continuous physical property, although they are a stack of layers having different compositions. In the drawings in this specification, interfaces between the layers of the stack are indicated by dotted lines.

The oxide semiconductor layer 530 in which layers containing the same main components are stacked is formed to have not only a simple stacked-layer structure of the layers but also a continuous energy band (here, in particular, a well structure having a U shape in which energies of the conduction band minimums are changed continuously between layers). In other words, the stacked-layer structure is formed such that there is no impurity which forms a defect level such as a trap center or a recombination center at each interface. If impurities are mixed between the stacked oxide semiconductor layers, the continuity of the energy band is lost and in some cases, carriers at the interface disappear by a trap or recombination.

In order to form the continuous energy band, the layers need to be stacked successively without being exposed to the air by using a multi-chamber deposition system (sputtering apparatus) provided with a load lock chamber. It is preferable that each chamber of the sputtering apparatus be able to be evacuated to a high vacuum (to about $5\times10^{-7}$ Pa to $1\times10^{-4}$ Pa) by an adsorption vacuum pump such as a cryopump and that the chamber be able to heat a substrate over which a film is to be deposited to 100° C. or higher, preferably 500° C. or higher so that water and the like acting as impurities of the oxide semiconductor are removed as much as possible. Alternatively, a combination of a turbo molecular pump and a cold trap is preferably used to prevent back-flow of a gas containing a carbon component, moisture, or the like from an exhaust system into the chamber.

Not only high vacuum evaporation in a chamber but also high purity of a sputtering gas is necessary to obtain a high-purity intrinsic oxide semiconductor. When a highly purified gas having a dew point of −40° C. or lower, preferably −80° C. or lower, further preferably −100° C. or lower is used as an oxygen gas or an argon gas used as a sputtering gas, moisture or the like can be prevented from entering the oxide semiconductor film as much as possible.

Note that FIG. 14A shows the case where EcS1 and EcS3 are similar to each other; however, EcS1 and EcS3 may be different from each other. For example, in the case where EcS1 is higher than EcS3, part of the band structure can be shown as in FIG. 14B.

For example, when EcS1 is equal to EcS3, an In—Ga—Zn oxide whose atomic ratio of In to Ga and Zn is 1:3:2, 1:3:4, 1:6:4, or 1:9:6 can be used for the first oxide semiconductor layer 531 and the third oxide semiconductor layer 533 and an In—Ga—Zn oxide whose atomic ratio of In to Ga and Zn is 1:1:1 or 3:1:2 can be used for the second oxide semiconductor layer 532. Further, when EcS1 is higher than EcS3, an In—Ga—Zn oxide whose atomic ratio of In to Ga and Zn is 1:6:4 or 1:9:6 can be used for the first oxide semiconductor layer 531, an In—Ga—Zn oxide whose atomic ratio of In to Ga and Zn is 1:1:1 or 3:1:2 can be used for the second oxide semiconductor layer 532, and an In—Ga—Zn oxide whose atomic ratio of In to Ga and Zn is 1:3:2 or 1:3:4 can be used for the third oxide semiconductor layer 533, for example. Note that the atomic ratio of each of the first oxide semiconductor layer 531, the second oxide semiconductor layer 532, and the third oxide semiconductor layer 533 varies within a range of ±20% of the above atomic ratio as an error.

According to FIGS. 14A and 14B, the second oxide semiconductor layer 532 of the oxide semiconductor layer 530 serves as a well, so that a channel is formed in the second oxide semiconductor layer 532 in the transistor including the oxide semiconductor layer 530. Note that since the energies of the conduction band minimums are changed continuously, the oxide semiconductor layer 530 can also be referred to as a U-shaped well. Further, a channel formed to have such a structure can also be referred to as a buried channel.

Note that trap levels due to impurities or defects might be formed in the vicinity of the interface between an insulating film such as a silicon oxide film and each of the first oxide semiconductor layer 531 and the third oxide semiconductor layer 533. The second oxide semiconductor layer 532 can be distanced away from the trap levels because of existence of the first oxide semiconductor layer 531 and the third oxide semiconductor layer 533. However, when the energy difference between EcS1 and EcS2 and the energy difference between EcS3 and EcS2 is small, an electron in the second oxide semiconductor layer 532 might reach the trap level by passing over the energy difference. When the electron is trapped by the trap state, it becomes negative fixed electric charge, so that the threshold voltage of the transistor is shifted in the positive direction.

Thus, the energy difference between EcS1 and EcS2 and the energy gap between EcS3 and EcS2 are each preferably 0.1 eV or larger, further preferably 0.15 eV or larger, so that a change in the threshold voltage of the transistor is reduced and the transistor can have stable electrical characteristics.

Note that at least one of the first oxide semiconductor layer 531, the second oxide semiconductor layer 532, and the third oxide semiconductor layer 533 preferably contains a crystal part. In particular, a crystal part included in each of the second oxide semiconductor layer 532 and the third oxide semiconductor layer 533 preferably includes a crystal whose c-axis is aligned in a direction substantially perpendicular to its surface. For example, the CAAC-OS film described in Embodiment 1 can be used as the film including such a crystal.

In the transistor having the structure in FIGS. 13A and 13B, the third oxide semiconductor layer 533 is in contact with the source electrode 540 and the drain electrode 550, and it is preferable that the energy gap of the third oxide semiconductor layer 533 be not large like an insulator and the film thickness of the third oxide semiconductor layer 533 be small in order that current can be extracted efficiently. Further, in the case where an In—Ga—Zn oxide is used for the oxide semiconductor layer 530, it is preferable that the third oxide semiconductor layer 533 contain less In than the second oxide semiconductor layer 532 so that diffusion of In to the gate insulating film can be prevented.

For the source electrode 540 and the drain electrode 550, a conductive material which is easily bonded to oxygen is preferably used. For example, Al, Cr, Cu, Ta, Ti, Mo, or W can be used. Among the materials, in particular, it is preferable to use Ti which is easily bonded to oxygen or W with a high melting point, which allows subsequent process temperatures to be relatively high. Note that a conductive material which is easily bonded to oxygen includes a material where oxygen is easily diffused.

When a conductive material which is easily bonded to oxygen is in contact with an oxide semiconductor layer, a phenomenon where oxygen in the oxide semiconductor layer is diffused into the conductive material which is easily bonded to oxygen occurs. The phenomenon noticeably occurs when the temperature is high. Since the fabrication process of the transistor involves some heat treatment steps, the above phenomenon causes generation of oxygen vacancies in a region of the oxide semiconductor layer which is near and in contact with the source electrode or the drain electrode, and the region is changed to an n-type. Thus, the n-type region can serve as a source or a drain of the transistor.

The above n-type region in the oxide semiconductor layer 530 of the transistor in FIG. 13B is indicated by a dotted line which forms a boundary 535. The boundary 535 is the boundary between an intrinsic semiconductor region and the n-type semiconductor region. In the oxide semiconductor layer 530, a region near and in contact with the source electrode 540 or the drain electrode 550 becomes the n-type region. The boundary 535 is schematically illustrated here, but actually the boundary is not clearly seen in some cases. Further, the boundary 535 extends in the lateral direction in the second oxide semiconductor layer 532 in FIG. 13B; however, the boundary 535 might extend in the lateral direction in the first oxide semiconductor layer 531 or the third oxide semiconductor layer 533. In the oxide semiconductor layer 530, a region sandwiched between the base insulating film 520 and the source electrode 540 or between the base insulating film 520 and the drain electrode 550 may entirely become n-type in the film thickness direction.

However, in the case of forming a transistor with an extremely short channel length, the n-type region which is formed by the generation of the oxygen vacancies sometimes extends in the channel length direction of the transistor. In that case, as for electrical characteristics of the transistor, the threshold voltage is shifted or on/off of the transistor cannot be controlled with the gate voltage (i.e., the transistor is on). Accordingly, when a transistor with an extremely short channel length is formed, it is not always preferable that the conductive material which is easily bonded to oxygen be used for a source electrode and a drain electrode.

Figure 15A:
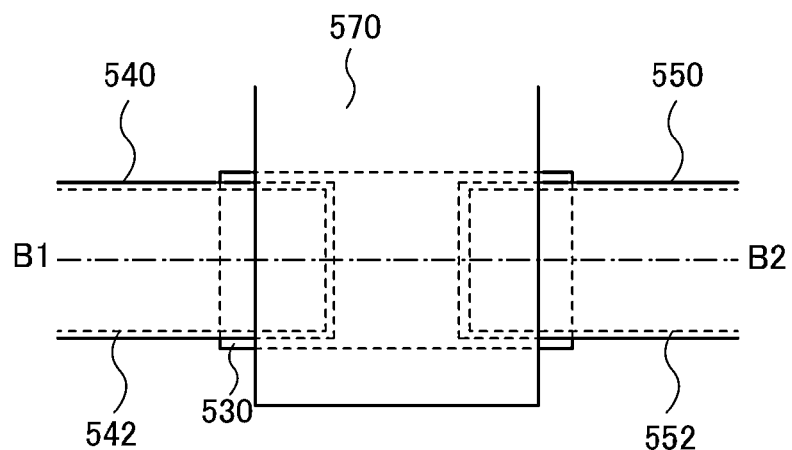
FIG. 15A is a top view illustrating a semiconductor device and FIG. 15B is a cross-sectional view thereof.
Figure 15B:
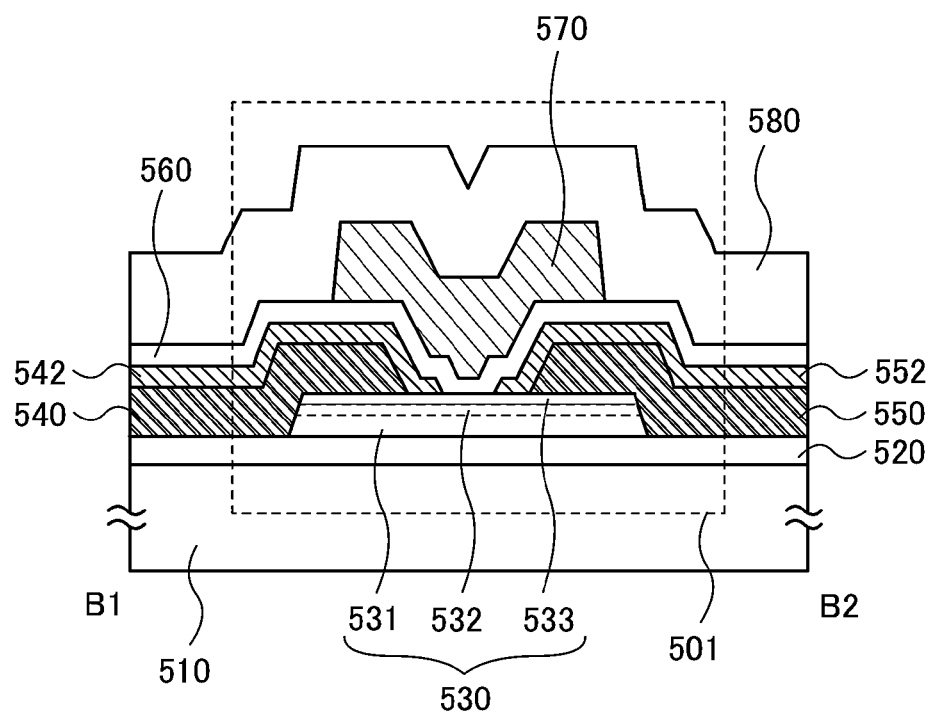

Thus, the source electrode and the drain electrode may each have a stacked-layer structure. In that case, as in a transistor 501 illustrated in FIGS. 15A and 15B, a second source electrode 542 and a second drain electrode 552 are favorably formed with a conductive material which is not easily bonded to oxygen so as to cover the source electrode 540 and the drain electrode 550, respectively. Here, FIG. 15A is the top view, and a cross section taken along dashed-dotted line B1-B2 in FIG. 15A is illustrated in FIG. 15B. Note that for simplification of the drawing, some components in the top view in FIG. 15A are not illustrated.

The source electrode 540 and the drain electrode 550 can be formed using, for example, a titanium film, and the second source electrode 542 and the second drain electrode 552, which determine the channel length, can be formed using, for example, a material containing tantalum nitride, titanium nitride, or ruthenium, or the like. Note that the conductive material which is not easily bonded to oxygen also includes, in its category, a material to which oxygen is not easily diffused.

With the use of the above conductive material which is not easily bonded to oxygen for the second source electrode 542 and the second drain electrode 552, generation of oxygen vacancies in a channel formation region of the oxide semiconductor layer can be suppressed, so that a change of the channel to an n-type can be suppressed. In this manner, even a transistor with an extremely short channel length can have favorable electrical characteristics.

In the case where the source electrode and the drain electrode are formed using only the above conductive material which is not easily bonded to oxygen, the contact resistance with the oxide semiconductor layer 530 becomes too high; thus, it is preferable that as illustrated in FIGS. 15A and 15B, the source electrode 540 and the drain electrode 550 be formed over the oxide semiconductor layer 530 and the second source electrode 542 and the second drain electrode 552 be formed so as to cover the source electrode 540 and the drain electrode 550.

At this time, it is preferable that the oxide semiconductor layer 530 have a large contact area with the source electrode 540 or the drain electrode 550, and the oxide semiconductor layer 530 have a small contact area with the second source electrode 542 or the second drain electrode 552. The region of the oxide semiconductor layer 530, which is in contact with the source electrode 540 or the drain electrode 550, is changed to an n-type region due to generation of oxygen vacancies. When the contact resistance of the second source electrode 542 and the second drain electrode 552 with the oxide semiconductor layer 530 is large, electrical characteristics of the transistor deteriorate in some cases.

Note that the oxide semiconductor layer 530 does not necessary have a large contact area with the source electrode 540 or the drain electrode 550 in the case where a nitride such as tantalum nitride or titanium nitride is used for the second source electrode 542 and the second drain electrode 552. This is because when nitrogen in the nitride is slightly diffused to a region of the oxide semiconductor layer 530, which is close to the interface with the second source electrode 542 and the second drain electrode 552, nitrogen contributes to formation of a donor level and an n-type region is formed in the oxide semiconductor layer 530; accordingly, the contact resistance between the oxide semiconductor layer 530 and the second source electrode 542 or the second drain electrode 552 can be reduced.

Even when the distance between the second source electrode 542 and the second drain electrode 552 is, for example, 30 nm or shorter, the transistor can have favorable electrical characteristics.

The gate insulating film 560 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 560 may be a stack of any of the above materials.

For the gate electrode 570, a conductive film of Al, Ti, Cr, Co, Ni, Cu, Y, Zr, Mo, Ru, Ag, Ta, W, or the like can be used. The gate electrode 570 may be a stack of any of the above materials.

Further, the oxide insulating layer 580 may be formed over the gate insulating film 560 and the gate electrode 570. The oxide insulating layer 580 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The oxide insulating layer 580 may be a stack of any of the above materials.

Here, the oxide insulating layer 580 preferably contains excess oxygen. The oxide insulating layer having excess oxygen means an oxide insulating layer from which oxygen can be released by heat treatment or the like. The oxide insulating layer 580 is preferably a film in which the amount of released oxygen when converted into oxygen atoms is $1.0 \times 10^{19}$ atoms/cm$^3$ or more in thermal desorption spectroscopy analysis. Oxygen released from the oxide insulating layer 580 can be diffused to the channel formation region of the oxide semiconductor layer 530 through the gate insulating film 560, so that oxygen vacancies which are undesirably formed can be compensated with the oxygen. In this manner, stable electrical characteristics of the transistor can be achieved.

The above is the description of the transistor of one embodiment of the present invention. The transistor has favorable electrical characteristics, so that a semiconductor device having high long-term reliability can be manufactured.

Figure 16A:
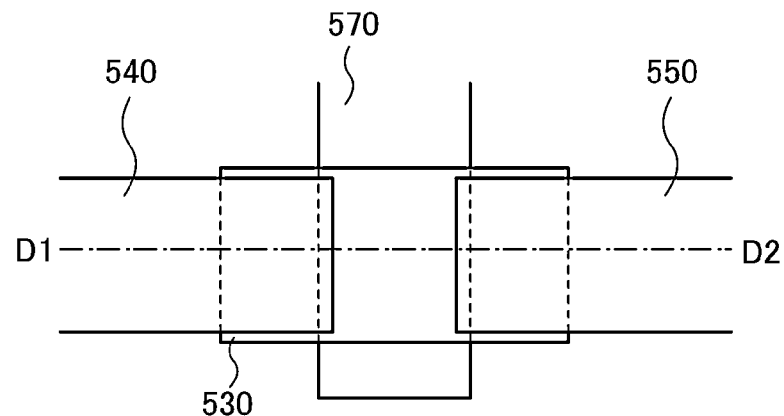
FIG. 16A is a top view illustrating a semiconductor device and FIG. 16B is a cross-sectional view thereof.
Figure 16B:
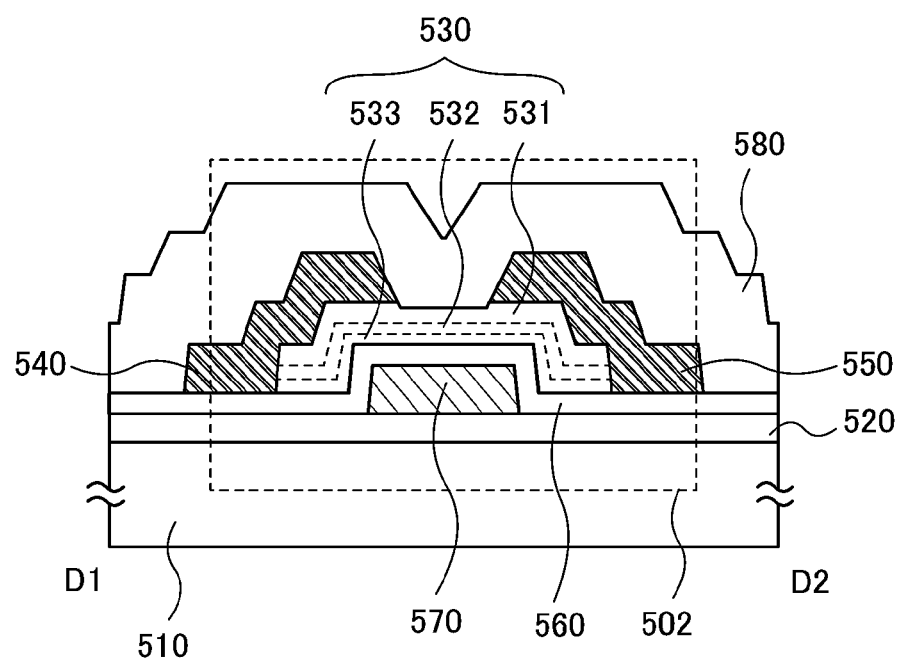

Note that the transistor of one embodiment of the present invention may have a structure illustrated in FIGS. 16A and 16B. FIG. 16A is the top view, and a cross section taken along dashed-dotted line D1-D2 in FIG. 16A is illustrated in FIG. 16B. Note that for simplification of the drawing, some components in the top view in FIG. 16A are not illustrated.

A transistor 502 in FIGS. 16A and 16B has a channel-etched back-gate structure and includes the base insulating film 520 formed over the substrate 510; the gate electrode 570 formed over the base insulating film 520; the gate insulating film 560 formed over the base insulating film 520 and the gate electrode 570; the oxide semiconductor layer 530 formed over the gate insulating film 560 so as to overlap with the gate electrode 570; and the source electrode 540 and the drain electrode 550 formed over the oxide semiconductor layer 530. Further, the oxide insulating layer 580 may be formed over the oxide semiconductor layer 530, and the source electrode 540 and the drain electrode 550. Note that the oxide insulating layer 580 may be provided as needed and another insulating layer may be further provided thereover.

In the case where the transistor 502 is used for a display device or the like, the gate electrode 570 serves as a light-blocking layer; therefore, light emitted to a channel formation region of the oxide semiconductor layer 530 from a backlight or the like can be blocked. Therefore, it is possible to prevent photodegradation of the transistor 502, and thus to obtain a highly reliable semiconductor device.

Note that also in the transistor 500, which has a top-gate structure, a light-blocking layer can be provided between the base insulating film 520 and the substrate 510.

Figure 17A:
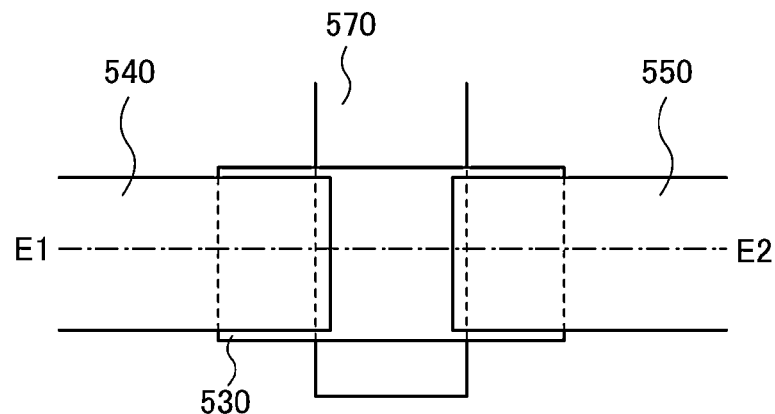
FIG. 17A is a top view illustrating a semiconductor device and FIG. 17B is a cross-sectional view thereof.
Figure 17B:
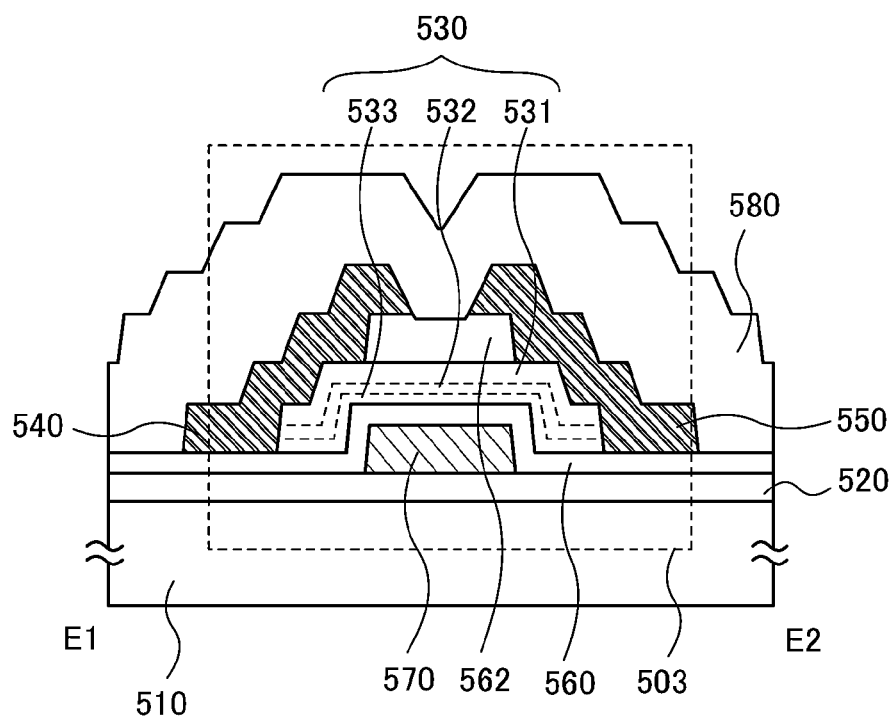

Note that the transistor of one embodiment of the present invention may have a structure illustrated in FIGS. 17A and 17B. FIG. 17A is the top view, and a cross section taken along dashed-dotted line E1-E2 in FIG. 17A is illustrated in FIG. 17B. Note that for simplification of the drawing, some components in the top view in FIG. 17A are not illustrated.

A transistor 503 in FIGS. 17A and 17B has a channel-protective back-gate structure, which is a structure in which a protective film 562 is provided in the transistor 502. By providing the protective film 562, over-etching of the oxide semiconductor layer 530 can be suppressed. In the case where dry etching is employed in an etching step, plasma damage to the oxide semiconductor layer 530 can be suppressed. Therefore, in the case where a plurality of transistors are formed in a large area, transistors with high reliability and less fluctuation in electrical characteristics can be formed. Note that the protective film 562 can be formed using the material that can be used for the base insulating film 520, the gate insulating film 560, or the oxide insulating layer 580.

Note that in the same manufacturing process as the oxide semiconductor layer 530, a semiconductor layer, which is formed in a different region, can be used to form a resistor. Further, a protective circuit can be formed using the resistor. The protective circuit protects against damage from static electricity or the like.

In each of the top views illustrating the structures of the transistors 500 to 503, compared to the length of the oxide semiconductor layer 530 in the channel width direction, the length of the source electrode 540 or the drain electrode 550 in the same direction is short (in the transistor 501, the length of the second source electrode 542 or the second drain electrode 552 is also short). This is because, when the source electrode 540 or the drain electrode 550 covers the end portion of the oxide semiconductor layer 530 in the channel width direction, part of an electric field from the gate electrode 570 is blocked, so that the electric field is not easily applied to the oxide semiconductor layer 530.

Figure 18A:
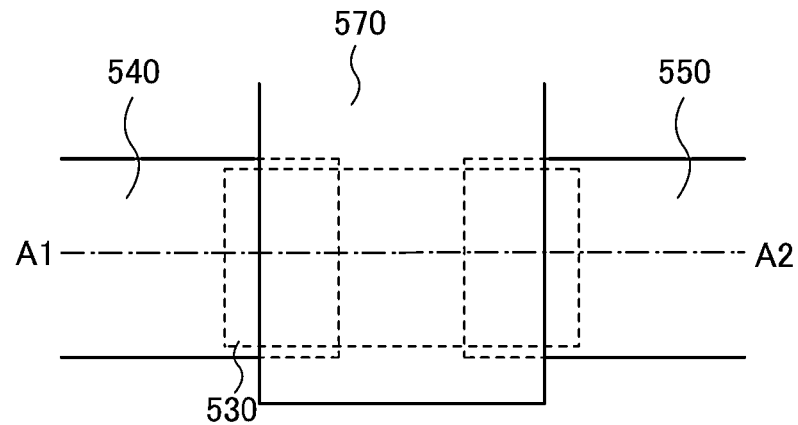
FIGS. 18A to 18C are top views each illustrating a semiconductor device.
Figure 18B:
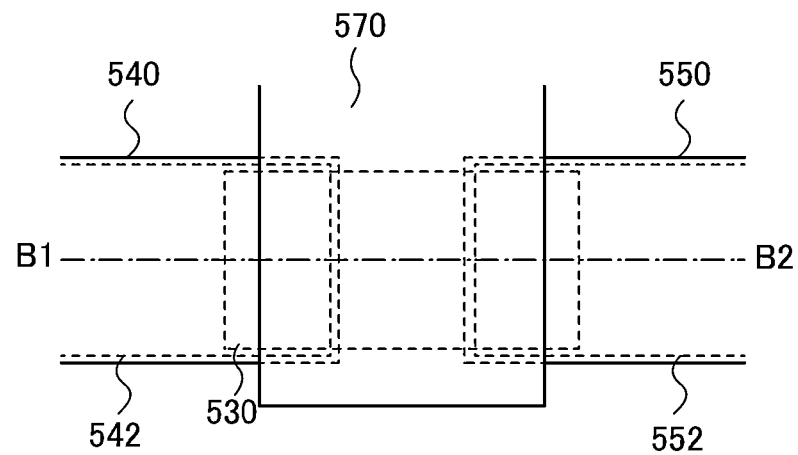
Figure 18C:
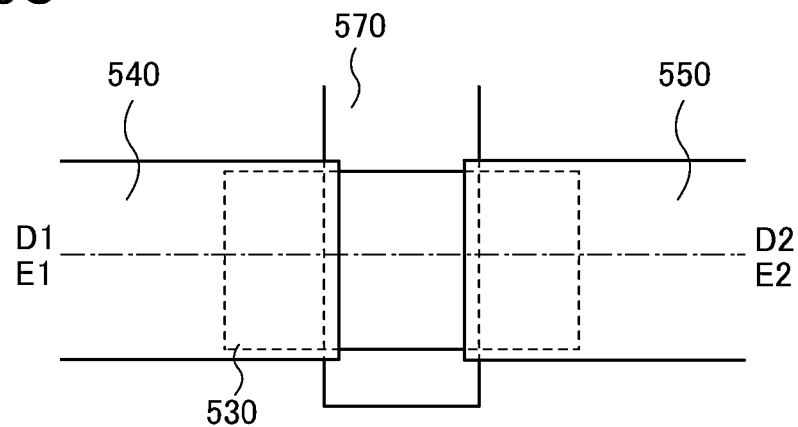

Therefore, it is preferable that the source electrode 540 or the drain electrode 550 have the above shape; however, the shape of the source electrode 540 or the drain electrode 550 is not limited to the above as long as the electrical characteristics of the transistor can be sufficiently satisfied. For example, in the transistor 500 and the transistor 501, as illustrated in FIGS. 18A and 18B, compared to the length of the oxide semiconductor layer 530 in the channel width direction, the length of the source electrode 540 or the drain electrode 550 in the same direction may be long. Similarly, the transistor 502 and the transistor 503 may have a structure illustrated in FIG. 18C. With the structure illustrated in FIG. 18A, 18B, or 18C, the degree of difficulty in a photolithography process can be reduced.

Note that this embodiment can be combined as appropriate with any of the other embodiments and an example in this specification.

Embodiment 3

In this embodiment, a method for manufacturing the transistor 500 described in Embodiment 2 with reference to FIGS. 13A and 13B will be described with reference to FIGS. 19A to 19C and FIGS. 20A to 20C. Note that each of the transistor 501 in FIGS. 15A and 15B, the transistor 502 in FIGS. 16A and 16B, and the transistor 503 in FIGS. 17A and 17B can be formed by, for example, changing a resist mask in a photolithography process or changing the order of steps with reference to Embodiment 2 where the transistors are described and the method for manufacturing the transistor described in this embodiment.

For the substrate 510, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Still alternatively, any of these substrates further provided with a semiconductor element may be used.

Figure 19A:
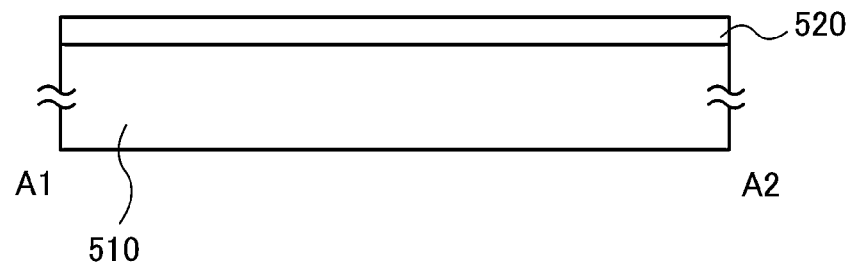
FIGS. 19A to 19C are cross-sectional views illustrating a method for manufacturing a semiconductor device.

The base insulating film 520 is formed over the substrate 510 (see FIG. 19A). The base insulating film 520 can be formed by a plasma CVD method, a sputtering method, or the like using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a mixed material of any of these. Alternatively, a stack containing any of the above materials may be used, and at least an upper layer of the base insulating film 520 which is in contact with the oxide semiconductor layer 530 is preferably formed using a material containing oxygen that might serve as a supply source of oxygen to the oxide semiconductor layer 530.

In the case where the surface of the substrate 510 is made of an insulator and there is no influence of impurity diffusion to the oxide semiconductor layer 530 to be formed later, the base insulating film 520 is not necessarily provided.

Figure 19B:
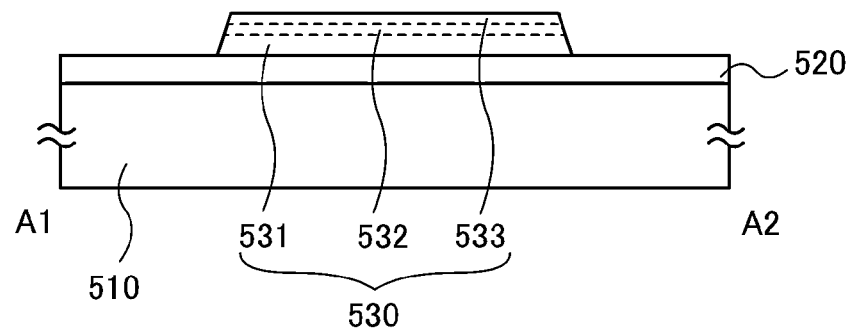

Then, the first oxide semiconductor layer 531, the second oxide semiconductor layer 532, and the third oxide semiconductor layer 533 are formed over the base insulating film 520 by a sputtering method, a CVD method, a MBE method, an ALD method, or a PLD method and selectively etched, so that the oxide semiconductor layer 530 is formed (see FIG. 19B). Note that heating may be performed before etching. As described in Embodiment 2, the oxide semiconductor layer 530 may be a single layer or a stack of two layers or four or more layers.

For the first oxide semiconductor layer 531, the second oxide semiconductor layer 532, and the third oxide semiconductor layer 533, the material described in Embodiment 2 can be used. For example, an In—Ga—Zn oxide whose atomic ratio of In to Ga and Zn is 1:3:2 can be used for the first oxide semiconductor layer 531, an In—Ga—Zn oxide whose atomic ratio of In to Ga and Zn is 1:1:1 can be used for the second oxide semiconductor layer 532, and an In—Ga—Zn oxide whose atomic ratio of In to Ga and Zn is 1:3:2 can be used for the third oxide semiconductor layer 533.

An oxide semiconductor that can be used for each of the first oxide semiconductor layer 531, the second oxide semiconductor layer 532, and the third oxide semiconductor layer 533 preferably contains at least indium (In) or zinc (Zn). Alternatively, both In and Zn are preferably contained. In order to reduce fluctuations in electrical characteristics of the transistors including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide.

Note that, for example, an In—Ga—Zn oxide means an oxide containing In, Ga, and Zn as its main components and there is no particular limitation on the ratio of In to Ga and Zn. The In—Ga—Zn oxide may contain another metal element in addition to In, Ga, and Zn. Further, in this specification, a film formed using an In—Ga—Zn oxide is also referred to as an In—Ga—Zn—O film.

Alternatively, a material represented by $InMO_3(ZnO)_m$ (m>0 is satisfied, and m is not an integer) may be used. Note that M represents one or more metal elements selected from Ga, Fe, Mn, or Co. Alternatively, a material represented by $In_2SnO_5(ZnO)_n$ (n>0, n is an integer) may be used.

Note that as described in Embodiment 2 in detail, a material of the first oxide semiconductor layer 531 and the third oxide semiconductor layer 533 is selected so that the first oxide semiconductor layer 531 and the third oxide semiconductor layer 533 each have an electron affinity lower than that of the second oxide semiconductor layer 532.

Note that an oxide semiconductor film is preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

In the case where an In—Ga—Zn oxide is used for each of the first oxide semiconductor layer 531, the second oxide semiconductor layer 532, and the third oxide semiconductor layer 533, a material whose atomic ratio of In to Ga and Zn is any of 1:1:1, 2:2:1, 3:1:2, 1:3:2, 1:3:4, 1:4:3, 1:5:4, 1:6:6, 2:1:3, 1:6:4, 1:9:6, 1:1:4, and 1:1:2 is used so that the first oxide semiconductor layer 531 and the third oxide semiconductor layer 533 each have an electron affinity lower than that of the second oxide semiconductor layer 532.

Note that for example, the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The indium content of the second oxide semiconductor layer 532 is favorably higher than those of the first oxide semiconductor layer 531 and the third oxide semiconductor layer 533. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. Thus, with the use of an oxide having a high indium content for the second oxide semiconductor layer 532, a transistor having a high mobility can be achieved.

An oxide semiconductor may include a non-single-crystal, for example. The non-single-crystal state is, for example, structured by at least one of a c-axis aligned crystal (CAAC), a polycrystal, a microcrystal, and an amorphous part.

An oxide semiconductor may include CAAC, for example. Note that an oxide semiconductor including CAAC is referred to as a CAAC-OS (c-axis aligned crystalline oxide semiconductor).

In an image obtained with a transmission electron microscope (TEM), for example, crystal parts can be found in the CAAC-OS in some cases. In most cases, in the image obtained with the TEM, crystal parts in the CAAC-OS each fit inside a cube whose one side is less than 100 nm, for example. In the image obtained with the TEM, a boundary between the crystal parts in the CAAC-OS is not clearly observed in some cases. Further, in the image obtained with the TEM, a grain boundary in the CAAC-OS is not clearly observed in some cases. In the CAAC-OS, since a clear grain boundary does not exist, for example, segregation of an impurity is unlikely to occur. In the CAAC-OS, since a clear boundary does not exist, for example, a high defect level density is unlikely to occur. In the CAAC-OS, since a clear grain boundary does not exist, for example, a reduction in electron mobility is unlikely to occur.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak appears at 2θ of around 31° in some cases. In the case of a crystal of $InGaZnO_4$, the peak at 2θ of around 31° indicates that the crystal of $InGaZnO_4$ has (009) plane alignment. Further, in the CAAC-OS, a peak appears at 2θ of around 36° in some cases. In the case of a $ZnGa_2O_4$ crystal, the peak at 2θ of around 36° is derived from the (222) plane of the $ZnGa_2O_4$ crystal. In the CAAC-OS, it is preferable that the peak appears at 2θ of around 31° and do not appear at 2θ of around 36°.

In the CAAC-OS, for example, among crystal parts, the directions of the a-axis and the b-axis of one crystal part are different from those of another crystal part, in some cases. For example, when the CAAC-OS including a crystal of $InGaZnO_4$ is analyzed with an X-ray diffractometer by an in-plane method in which an X-ray enters a sample in a direction perpendicular to the c-axis, a peak appears at 2θ of around 56° in some cases. The peak at 2θ of around 56° is derived from the (110) plane of the $InGaZnO_4$ crystal. Here, when 2θ is fixed at around 56°, a sample is rotated using a normal vector of a surface of the sample as an axis (φ axis), and analysis (φ scan) is performed, although six peaks having symmetry appear in the case of a single crystal oxide semiconductor in which the directions of an a-axis and a b-axis of one crystal part are the same as those of another crystal part, a peak is not clearly observed in the case of the CAAC-OS.

As described above, in the CAAC-OS, for example, c-axes are aligned, and a-axes and/or b-axes are not macroscopically aligned, in some cases.

Further, for example, spots (luminescent spots) are shown in an electron diffraction pattern of the CAAC-OS in some cases. An electron diffraction pattern obtained with an electron beam having a diameter of 10 nmφ or smaller, or 5 nmφ or smaller, is called a nanobeam electron diffraction pattern.

In each of the crystal parts included in the CAAC-OS, for example, a c-axis is aligned in a direction parallel to a normal vector of a surface where the CAAC-OS is formed or a normal vector of a surface of the CAAC-OS. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

Further, the CAAC-OS can be formed by reducing the defect level density, for example. In an oxide semiconductor, for example, oxygen vacancies form a defect level. The oxygen vacancies serve as trap levels or serve as carrier generation sources when hydrogen is trapped therein. In order to form the CAAC-OS, for example, it is important to prevent oxygen vacancies from being generated in the oxide semiconductor. Thus, the CAAC-OS is an oxide semiconductor having a low defect level density. In other words, the CAAC-OS is an oxide semiconductor having few oxygen vacancies.

The state in which impurity concentration is low and a defect level density is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). Further, a highly purified intrinsic or substantially highly purified intrinsic oxide semiconductor has a low defect level density and accordingly has a low trap level density in some cases. Thus, the transistor including the oxide semiconductor in the channel formation region has a small change in electrical characteristics and a high reliability in some cases. A charge trapped by a trap state in the oxide semiconductor takes a long time to be released and may behave like a fixed charge. Thus, the transistor including the oxide semiconductor having a high density of trap states in the channel formation region has unstable electrical characteristics in some cases.

With the use of the highly purified intrinsic or substantially highly purified intrinsic CAAC-OS in a transistor, a change in the electrical characteristics of the transistor due to irradiation with visible light or ultraviolet light is small.

An oxide semiconductor may include a polycrystal, for example. Note that an oxide semiconductor including a polycrystal is referred to as a polycrystalline oxide semiconductor. A polycrystalline oxide semiconductor includes a plurality of crystal grains.

An oxide semiconductor may include a microcrystal, for example. Note that an oxide semiconductor including a microcrystal is referred to as a microcrystalline oxide semiconductor.

In an image obtained with the TEM, for example, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 nm and less than or equal to 10 nm is specifically referred to as nanocrystal (nc), for example. An oxide semiconductor including a nanocrystal is referred to as a nanocrystalline oxide semiconductor (nc-OS). In an image of the nc-OS obtained with the TEM, for example, a boundary between crystal parts is not clearly detected in some cases. In the image of the nc-OS obtained with the TEM, for example, since a clear grain boundary does not exist, segregation of an impurity is unlikely to occur. In the nc-OS, since a clear grain boundary does not exist, for example, a high defect level density is unlikely to occur. In the nc-OS, since a clear grain boundary does not exist, for example, a reduction in electron mobility is unlikely to occur.

In the nc-OS, for example, a microscopic region (e.g., a region with a size greater than or equal to 1 nm and less than or equal to 10 nm) has a periodic atomic order occasionally. Further, for example, in the nc-OS, crystal parts are not regularly arranged. Thus, there is a case where periodic atomic order is not observed macroscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than that of a crystal part, a peak which shows alignment does not appear in some cases. Further, for example, a halo pattern is shown in some cases in an electron diffraction pattern of the nc-OS obtained by using an electron beam having a diameter larger than that of a crystal part (e.g., a beam diameter of 20 nmφ or more, or 50 nmφ or more). For example, spots are shown in some cases in a nanobeam electron diffraction pattern of the nc-OS obtained by using an electron beam having a diameter smaller than or equal to that of a crystal part (e.g., a beam diameter of 10 nmφ or less, or 5 nmφ or less). In a nanobeam electron diffraction pattern of the nc-OS, for example, regions with high luminance in a circular pattern are shown in some cases. In a nanobeam electron diffraction pattern of the nc-OS, for example, a plurality of spots are shown in the region in some cases.

Since the microscopic region in the nc-OS has a periodic atomic order occasionally, the nc-OS has a lower defect level density than the amorphous oxide semiconductor. Note that since crystal parts in the nc-OS are not regularly arranged, the nc-OS has a higher defect level density than the CAAC-OS.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

A CAAC-OS film can be deposited by a sputtering method using a polycrystalline oxide semiconductor sputtering target, for example.

For the deposition of the CAAC-OS film, the following conditions are preferably used.

By reducing the amount of impurities entering the CAAC-OS film during the deposition, the crystal state can be prevented from being broken by the impurities. For example, impurities (e.g., hydrogen, water, carbon dioxide, or nitrogen) which exist in the deposition chamber may be reduced. Furthermore, impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As a sputtering target, an In—Ga—Zn—O compound target can be used, for example. The In—Ga—Zn—O compound target is a polycrystalline body which is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. The grain size of the polycrystalline body is preferably as small as possible, for example, less than or equal to 1 µm. The kinds of powder and the molar ratio for mixing powder may be determined as appropriate depending on the desired sputtering target.

Next, first heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the second oxide semiconductor layer 532 can be improved, and in addition, impurities such as hydrogen and water can be removed from the base insulating film 520, the first oxide semiconductor layer 531, and the third oxide semiconductor layer 533. Note that the first heat treatment may be performed before etching for forming the oxide semiconductor layer 530.

In the case where the oxide semiconductor layer 530 is a stack and an amorphous layer or a microcrystalline layer is formed as a lower layer, a CAAC-OS film can be easily formed thereover. Thus, it is preferable that the first oxide semiconductor layer 531 be an amorphous layer or a microcrystalline layer and the second oxide semiconductor layer 532 be a CAAC-OS film.

Next, a first conductive film to be the source electrode 540 and the drain electrode 550 is formed over the oxide semiconductor layer 530. For the first conductive film, Al, Cr, Cu, Ta, Ti, Mo, W, or an alloy material containing any of these as its main component can be used. For example, a 100-nm-thick titanium film is formed by a sputtering method or the like.

Figure 19C:
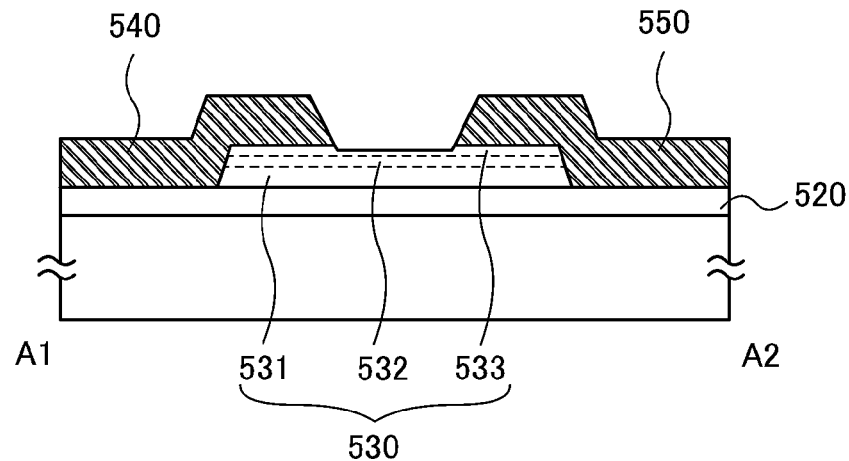

Then, the first conductive film is etched so as to be divided over the oxide semiconductor layer 530, so that the source electrode 540 and the drain electrode 550 are formed (see FIG. 19C).

At this time, the first conductive film is over-etched, so that the oxide semiconductor layer 530 is partly etched as illustrated in FIG. 19C. However, when the etching selectivity of the first conductive film to the oxide semiconductor layer 530 is high, the oxide semiconductor layer 530 is not etched in some cases.

Next, second heat treatment is preferably performed. The second heat treatment can be performed under a condition similar to that of the first heat treatment. By the second heat treatment, impurities such as hydrogen and water can be further removed from the oxide semiconductor layer 530.

Figure 20A:
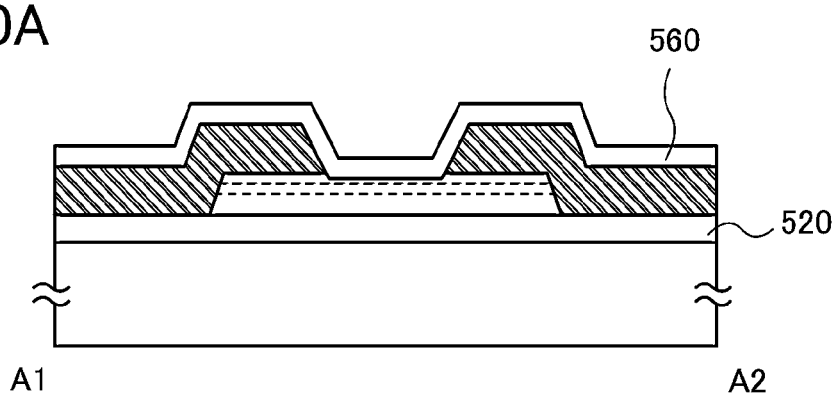
FIGS. 20A to 20C are cross-sectional views illustrating a method for manufacturing a semiconductor device.
Figure 20B:
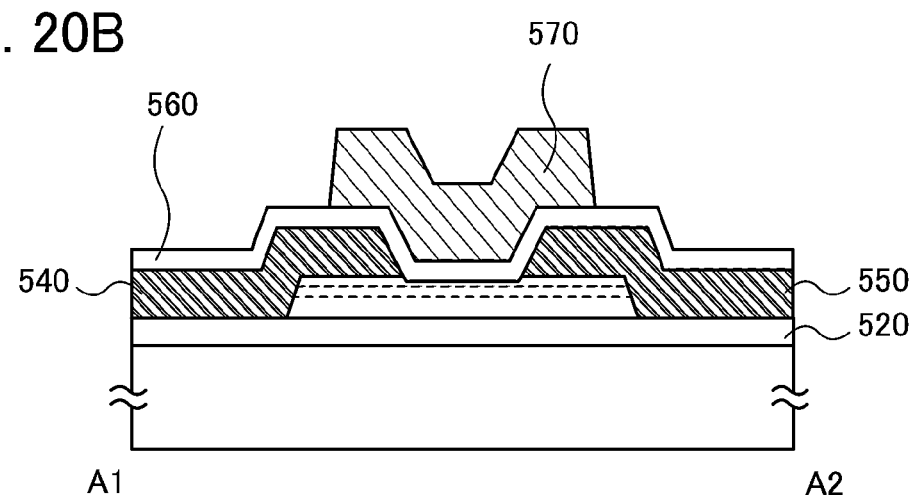

Then, the gate insulating film 560 is formed over the oxide semiconductor layer 530, and the source electrode 540 and the drain electrode 550 (see FIG. 20A). The gate insulating film 560 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The gate insulating film 560 may be a stack of any of the above materials. The gate insulating film 560 can be formed by a sputtering method, a CVD method, an MBE method, an ALD method, a PLD method, or the like.

After that, a second conductive film is formed over the gate insulating film 560. For the second conductive film, Al, Ti, Cr, Co, Ni, Cu, Y, Zr, Mo, Ru, Ag, Ta, W, or an alloy material containing any of these as its main component can be used. The second conductive film can be formed by a sputtering method or the like. The second conductive film is processed so that the gate electrode 570 is formed to overlap with the channel formation region (see FIG. 20B).

Figure 20C:
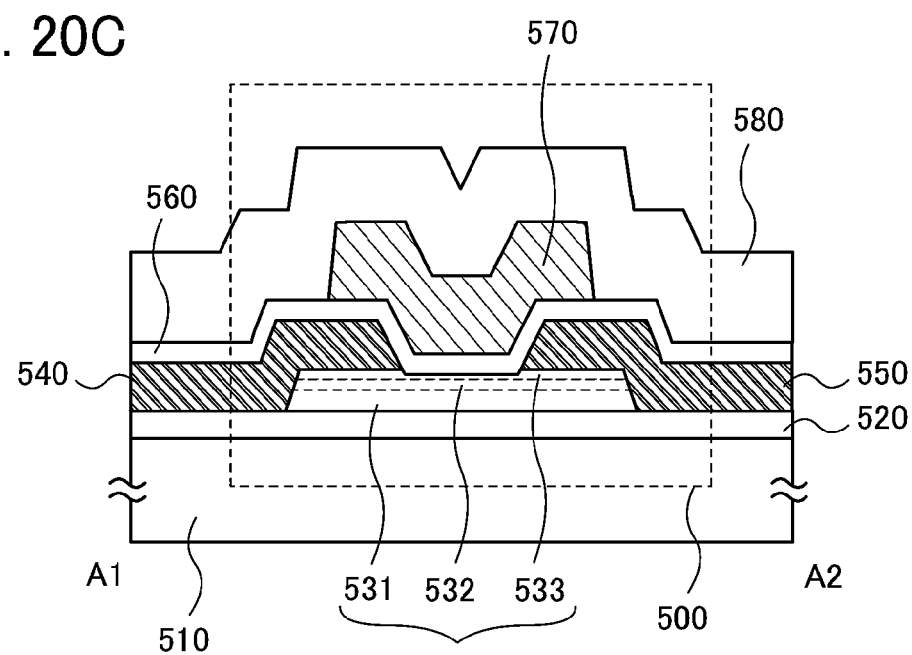

Next, the oxide insulating layer 580 is formed over the gate insulating film 560 and the gate electrode 570 (see FIG. 20C). The oxide insulating layer 580 can be formed by a sputtering method, a CVD method, an MBE method, an ALD method, a PLD method, or the like using the material that can be used for the base insulating film 520 or the gate insulating film 560. The oxide insulating layer 580 preferably contains excessive oxygen so as to be able to supply oxygen to the oxide semiconductor layer 530.

Oxygen may be added to the oxide insulating layer 580 by an ion implantation method, an ion doping method, a plasma immersion ion implantation method, or the like. By addition of oxygen, the oxide insulating layer 580 can supply oxygen much easily to the oxide semiconductor layer 530.

Next, third heat treatment is preferably performed. The third heat treatment can be performed under a condition similar to that of the first treatment. By the third heat treatment, excess oxygen is easily released from the base insulating film 520, the gate insulating film 560, and the oxide insulating layer 580, so that oxygen vacancies in the oxide semiconductor layer 530 can be reduced.

Although a metal film and the like described in this embodiment can be formed, typically, by a sputtering method or a plasma CVD method, such films may be formed by another method, for example, a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated because it does not utilize plasma for forming a film.

Deposition by a thermal CVD method may be performed in such a manner that a source gas and an oxidizer are supplied to a chamber at a time so that the pressure in the chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

Through the above process, the transistor 500 illustrated in FIGS. 13A and 13B can be manufactured.

Note that this embodiment can be combined as appropriate with any of the other embodiments and an example in this specification.

Embodiment 4

In this embodiment, examples of electronic devices using any of semiconductor devices described in Embodiment 1 to Embodiment 3 will be described.

The semiconductor devices described in Embodiment 1 to Embodiment 3 can be applied to a variety of electronic devices (including amusement machines). Examples of the electronic devices include display devices of televisions, monitors, and the like, lighting devices, personal computers, word processors, image reproduction devices, portable audio players, radios, tape recorders, stereos, phones, cordless phones, mobile phones, car phones, transceivers, wireless devices, game machines, calculators, portable information terminals, electronic notebooks, e-book readers, electronic translators, audio input devices, cameras such as video cameras and digital still cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipments such as dialyzers and X-ray diagnostic equipments. In addition, the examples of the electronic devices include alarm devices such as smoke detectors, heat detectors, gas alarm devices, and security alarm devices. Further, the examples include industrial equipment such as guide lights, traffic lights, belt conveyors, elevators, escalators, industrial robots, and power storage systems. In addition, moving objects and the like driven by fuel engines and electric motors using power from non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Some specific examples of these electronic devices are illustrated in FIGS. 22A to 22C.

Figure 22A:
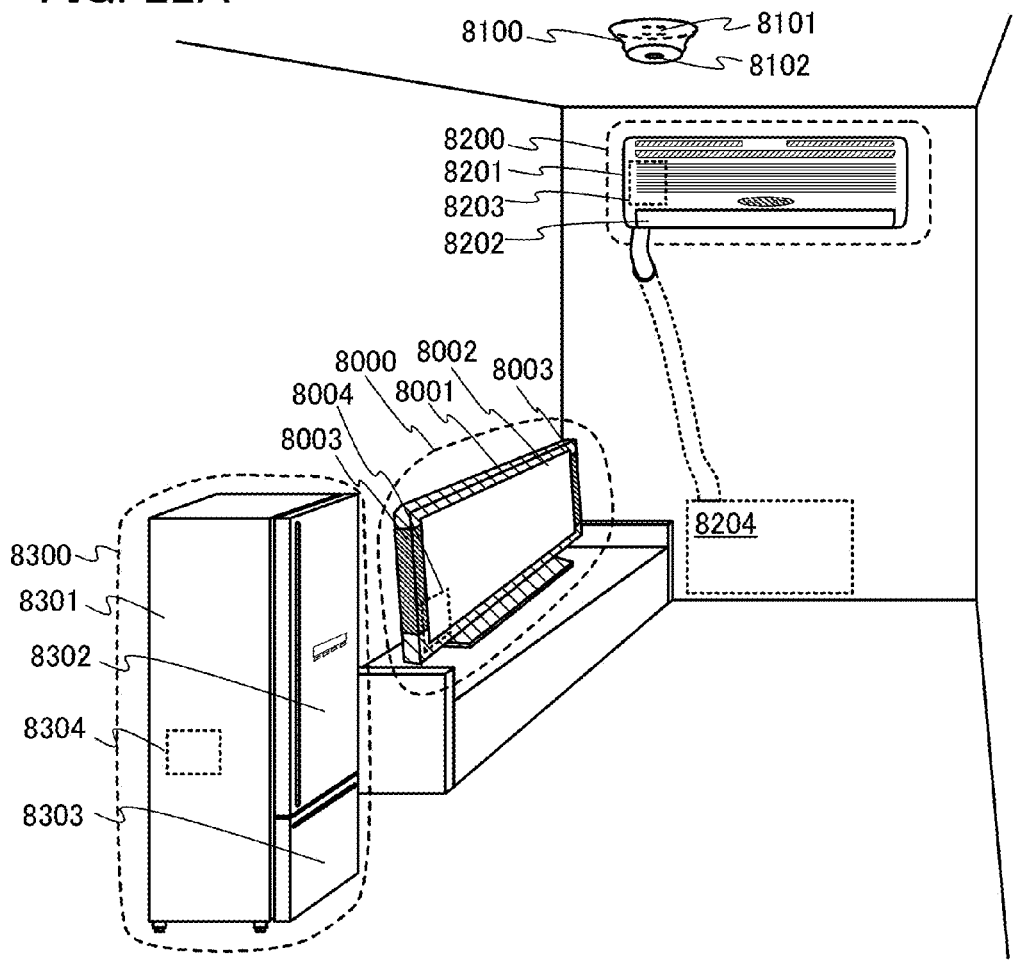
FIGS. 22A to 22C illustrate electronic devices.
Figure 22B:
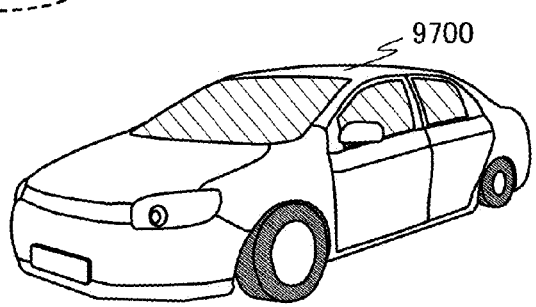
Figure 22C:
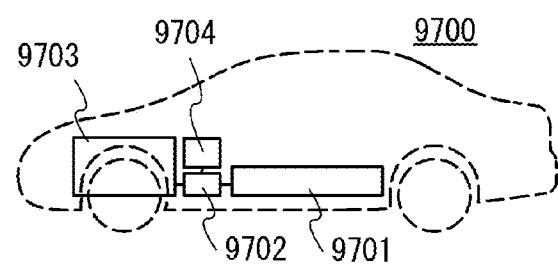

In a television set 8000 illustrated in FIG. 22A, a display portion 8002 is incorporated in a housing 8001. The display portion 8002 can display an image and a speaker portion 8003 can output sound. A memory device including the semiconductor device of one embodiment of the present invention can be used for a driver circuit for operating the display portion 8002.

In addition, the television set 8000 may include a memory or a CPU 8004 for performing information communication. A CPU and a memory device including the semiconductor device of one embodiment of the present invention can be applied to the memory or the CPU 8004.

An alarm device 8100 illustrated in FIG. 22A is a residential fire alarm. The alarm device 8100 includes a sensor portion 8102 for smoke or heat and a microcomputer 8101. Note that the microcomputer 8101 is an example of an electric device including the semiconductor device described in the above embodiment.

An air conditioner which includes an indoor unit 8200 and an outdoor unit 8204 illustrated in FIG. 22A is an example of an electric device including the semiconductor device described in any of the above embodiments. Specifically, the indoor unit 8200 includes a housing 8201, an air outlet 8202, a CPU 8203, and the like. Although the CPU 8203 is provided in the indoor unit 8200 in FIG. 22A, the CPU 8203 may be provided in the outdoor unit 8204. Alternatively, the CPU 8203 may be provided in both the indoor unit 8200 and the outdoor unit 8204. When the semiconductor device described in any of the above embodiments is used for the air conditioner, power saving can be achieved.

An electric refrigerator-freezer 8300 illustrated in FIG. 22A is an example of an electric device including the semiconductor device described in the above embodiment. Specifically, the electric refrigerator-freezer 8300 includes a housing 8301, a door for a refrigerator 8302, a door for a freezer 8303, a CPU 8304, and the like. In FIG. 22A, the CPU 8304 is provided in the housing 8301. When the semiconductor device described in the above embodiment is used for the electric refrigerator-freezer 8300, power saving can be achieved.

FIG. 22B illustrates an example of an electric vehicle which is an example of an electric device. An electric vehicle 9700 is equipped with a secondary battery 9701. The output of the electric power of the secondary battery 9701 is adjusted by a circuit 9702 and the electric power is supplied to a driving device 9703. The circuit 9702 is controlled by a processing unit 9704 including a ROM, a RAM, a CPU, or the like which is not illustrated. When the semiconductor device described in the above embodiment is used for the electric vehicle 9700, power saving can be achieved.

The driving device 9703 includes a DC motor or an AC motor either alone or in combination with an internal-combustion engine. The processing unit 9704 outputs a control signal to the circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The circuit 9702 adjusts the electric energy supplied from the secondary battery 9701 in response to the control signal of the processing unit 9704 to control the output of the driving device 9703. In the case where the AC motor is mounted, although not illustrated, an inverter which converts direct current into alternate current is also incorporated.

Note that this embodiment can be combined as appropriate with any of the other embodiments and an example in this specification.

EXAMPLE

In this example, results of CPM measurement performed on an oxide semiconductor layer and results of experiments performed on a transistor including an oxide semiconductor layer in electrical characteristics will be described.

A sample used for CPM measurement which was fabricated in this example is first described with reference to FIG. 23A.

First, a 100-nm-thick In—Ga—Zn—O film whose atomic ratio of In to Ga and Zn is 1:1:1 was formed over a glass substrate 710. The In—Ga—Zn—O film was formed by a DC sputtering method with an In—Ga—Zn—O sputtering target whose atomic ratio of In to Ga and Zn is 1:1:1 and a sputtering gas containing argon and oxygen at a flow rate ratio of 1:1 at a substrate temperature of 200° C.

Next, the In—Ga—Zn—O film was selectively etched to form an island-like oxide semiconductor layer 730.

Then, heat treatment was performed at 450° C. under a nitrogen atmosphere for one hour, and then in dry air (under a dry atmosphere) for one hour.

After that, a stack of a 100-nm-thick titanium film, a 400-nm-thick aluminum film, and a 100-nm-thick titanium film was formed over the oxide semiconductor layer 730. The stack was formed by a DC sputtering method using a titanium metal and an aluminum metal as sputtering targets and argon as a sputtering gas. Then, the stack is selectively etched to form an electrode layer 740 and an electrode layer 750.

Next, heat treatment was performed at 300° C. in dry air (under a dry atmosphere) for one hour.

Then, an oxide insulating layer 780 was formed over the oxide semiconductor layer 530 and the electrode layers 740 and 750. For the oxide insulating layer 780, a silicon oxynitride film formed by a plasma CVD method was used. Formation conditions of the silicon oxynitride film were as follows: the substrate temperature was 220° C.; the flow rate of $SiH_4$ was 30 sccm or 120 sccm; the applied power was 150 W or 1000 W; and the deposition pressure was 40 Pa, 120 Pa, or 200 Pa.

The oxide insulating layer 780 takes a role of supplying oxygen to the oxide semiconductor layer 730. In this example, a plurality of samples in each of which the defect level density in the oxide semiconductor layer 730 was different were fabricated under the same formation conditions of the oxide semiconductor layer 730 and under different formation conditions of the oxide insulating layer 780.

After that, heat treatment was performed at 300° C. under a nitrogen atmosphere for one hour.

Figure 23A:
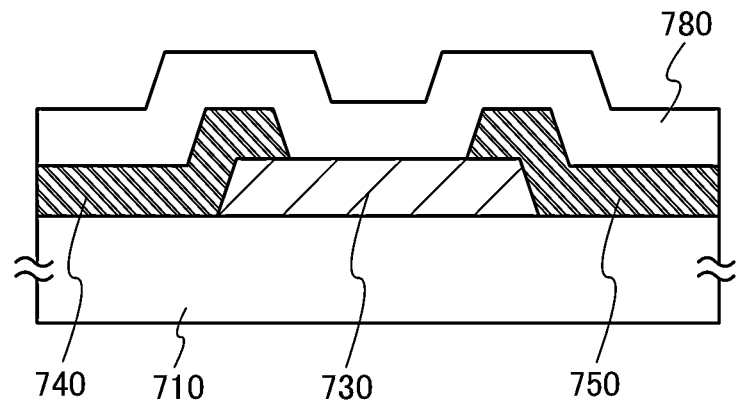
FIGS. 23A and 23B are cross-sectional views of a sample used for CPM measurement and a transistor.

Through the above process, the sample used for CPM measurement in FIG. 23A was fabricated.

Figure 23B:
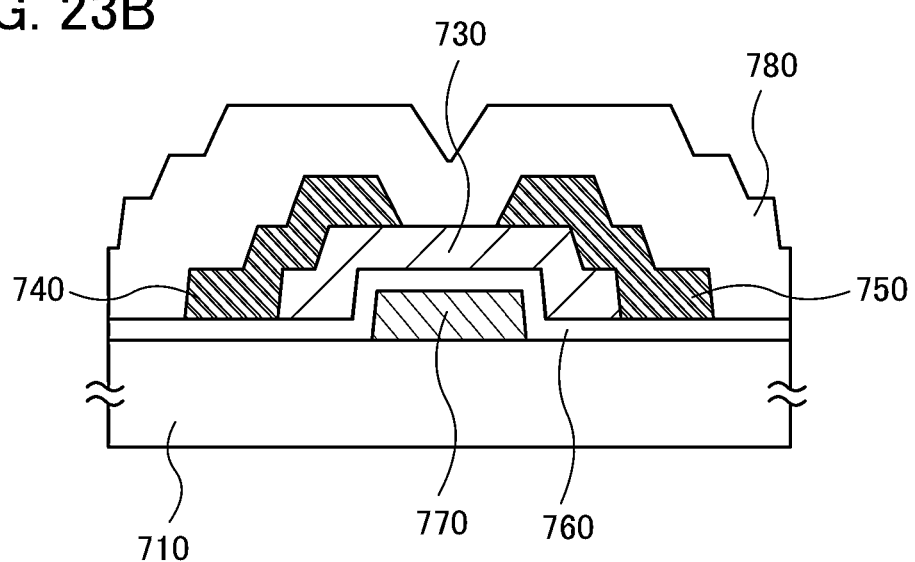

A transistor was fabricated under formation conditions similar to those of the above sample used for CPM measurement. The transistor has a bottom-gate structure illustrated in FIG. 23B and differs from the above sample used for CPM measurement in that a gate electrode 770 and a gate insulating film 760 are included and in the thickness of the oxide semiconductor layer 730. Note that the size of the transistor was L/W=6 μm/50 μm.

First, a 100-nm-thick tungsten film was formed over the glass substrate 710. The tungsten film was formed by a DC sputtering method using a tungsten metal as a sputtering target and argon as a sputtering gas. Then, the tungsten film was selectively etched to form the gate electrode 770.

Next, as the gate insulating film 760, a stack of a 50-nm-thick silicon nitride film and a 200-nm-thick silicon oxynitride film was formed by a plasma CVD method.

Then, a 35-nm-thick oxide semiconductor layer 730 (an In—Ga—Zn—O film) was formed in a manner similar to that of the sample used for CPM measurement.

Formation conditions of other elements and conditions for heat treatment and the like were similar to those of the sample used for CPM measurement. In this manner, the plurality of transistors each corresponding to the sample used for CPM measurement, in which the defect level density in the oxide semiconductor layer 730 was different, were fabricated.

Figure 24:
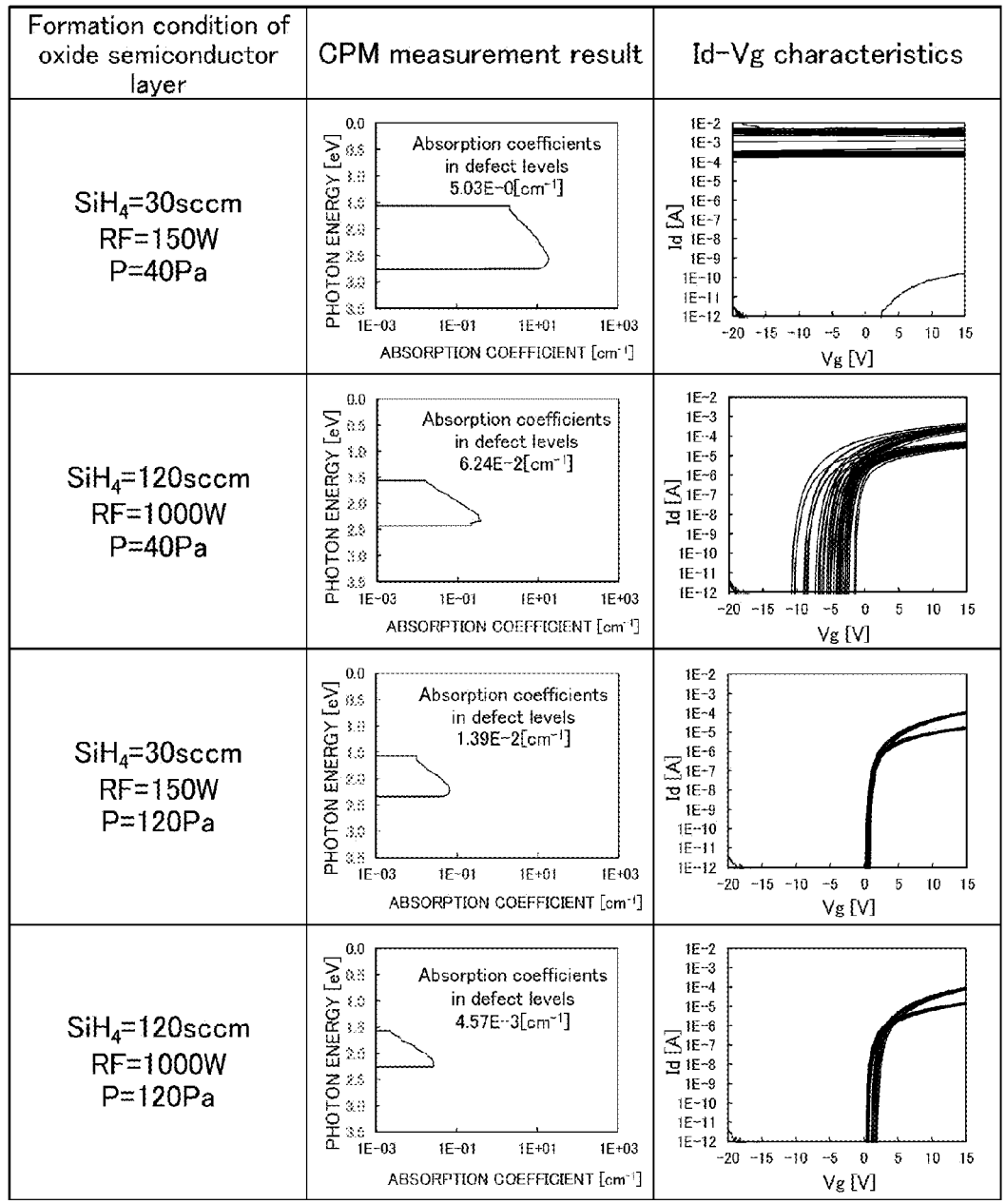
FIG. 24 is graphs showing CPM measurement results and Id-Vg characteristics of transistors.

FIG. 24 is graphs showing the CPM measurement result of each sample and Id-Vg characteristics of the transistors. The graphs are shown in the order where absorption coefficients in defect levels in the respective oxide semiconductor layers are higher from the top. The graphs show that the threshold voltage of the transistors is less shifted in the negative direction and the fluctuations of the threshold voltage are reduced as the absorption coefficients get lower.

From these results, it can be said that it is preferable to set an absorption coefficient in a defect level in the oxide semiconductor layer to be lower than or equal to $5 \times 10^{-2}$/cm in order to obtain at least normally-off characteristics (characteristics in an off state when Vg is 0 V). Note that a factor other than the defect level in the oxide semiconductor layer also causes a fluctuation or the like in the electrical characteristics of the transistors. Therefore, in some cases, the magnitude of the absorption coefficient in a defect level in the oxide semiconductor layer does not accord with the degree of the fluctuations in the electrical characteristics of the transistors.

Note that this example can be combined as appropriate with any of the embodiments in this specification.

This application is based on Japanese Patent Application serial No. 2013-044225 filed with the Japan Patent Office on Mar. 6, 2013 and Japanese Patent Application serial No. 2013-063720 filed with the Japan Patent Office on Mar. 26, 2013, the entire contents of which are hereby incorporated by reference.

What is claimed is:

1. A semiconductor device comprising:
a first electrode layer;
an insulating film in contact with the first electrode layer;
an oxide semiconductor layer overlapping with the first electrode layer with the insulating film provided therebetween; and
a second electrode layer in contact with the oxide semiconductor layer,
wherein light absorption of the oxide semiconductor layer is observed by a constant photocurrent method in a wavelength range of 400 nm to 800 nm,
wherein an absorption coefficient of a defect level, which is obtained by removing light absorption due to a band tail from the light absorption, is lower than or equal to $5 \times 10^{-2}$/cm, and
wherein the oxide semiconductor layer comprises a multilayer film.

2. The semiconductor device according to claim 1, wherein the oxide semiconductor layer comprises a crystal part whose c-axis is substantially perpendicular to a surface of the oxide semiconductor layer.

3. The semiconductor device according to claim 1,
wherein the oxide semiconductor layer is an In-M-Zn oxide, and
wherein M is any one of Al, Ti, Ga, Y, Zr, La, Ce, Nd, and Hf.

4. A semiconductor device comprising:
a gate electrode layer;
a gate insulating film in contact with the gate electrode layer;
an oxide semiconductor layer overlapping with the gate electrode layer with the gate insulating film provided therebetween; and
a source electrode layer and a drain electrode layer in contact with the oxide semiconductor layer,
wherein light absorption of the oxide semiconductor layer is observed by a constant photocurrent method in a wavelength range of 400 nm to 800 nm,
wherein an absorption coefficient of a defect level, which is obtained by removing light absorption due to a band tail from the light absorption, is lower than or equal to $5 \times 10^{-2}$/cm, and
wherein the oxide semiconductor layer is a multilayer film in which a first oxide semiconductor layer, a second oxide semiconductor layer, and a third oxide semiconductor layer are stacked in this order.

5. The semiconductor device according to claim 4, wherein the oxide semiconductor layer comprises a crystal part whose c-axis is substantially perpendicular to a surface of the oxide semiconductor layer.

6. The semiconductor device according to claim 4,
wherein the oxide semiconductor layer is an In-M-Zn oxide, and
wherein M is any one of Al, Ti, Ga, Y, Zr, La, Ce, Nd, and Hf.

7. The semiconductor device according to claim 4,
wherein an energy difference between an energy at the bottom of a conduction band of the first oxide semiconductor layer and an energy at the bottom of a conduction band of the second oxide semiconductor layer is greater than or equal to 0.05 eV and less than or equal to 2 eV, and
wherein an energy gap between an energy at the bottom of a conduction band of the third oxide semiconductor layer and the energy at the bottom of the conduction band of the second oxide semiconductor layer is greater than or equal to 0.05 eV and less than or equal to 2 eV.

8. The semiconductor device according to claim 4, wherein the second oxide semiconductor layer comprises a crystal part whose c-axis is substantially perpendicular to a surface of the second oxide semiconductor layer.

9. The semiconductor device according to claim 4,
wherein the first to third oxide semiconductor layers are each an In-M-Zn oxide,
wherein M is any one of Al, Ti, Ga, Y, Zr, La, Ce, Nd, and Hf, and
wherein an atomic ratio of M to In in each of the first oxide semiconductor layer and the third oxide semiconductor layer is larger than an atomic ratio of M to In in the second oxide semiconductor layer.

10. The semiconductor device according to claim 4,
wherein each of the source electrode layer and the drain electrode layer comprises a first electrode layer and a second electrode layer over the first electrode layer, and
wherein the second electrode layer is in contact with the oxide semiconductor layer in a region in which the gate electrode layer overlaps with the oxide semiconductor layer.

11. The semiconductor device according to claim 4,
wherein the oxide semiconductor layer has a first region between the source electrode layer and the drain electrode layer, and a second region which overlaps with the source electrode layer or the drain electrode layer, and
wherein a thickness of the oxide semiconductor layer in the first region is smaller than a thickness of the oxide semiconductor layer in the second region.

12. The semiconductor device according to claim 4, further comprising:
a protective film,
wherein the protective film is provided in contact with the oxide semiconductor layer, and
wherein the oxide semiconductor layer is provided between the gate electrode layer and the protective film.

13. The semiconductor device according to claim 4 is a transistor configured to be in an off-state when voltage applied to the gate electrode layer is 0.

* * * * *